US012706135B2

(12) United States Patent
Song et al.

(10) Patent No.: US 12,706,135 B2
(45) **Date of Patent: *Aug. 11, 2026**

(54) FAST LOOK NEIGHBOR AHEAD FOR DATA RECOVERY

(71) Applicant: Sandisk Technologies, Inc., Milpitas, CA (US)

(72) Inventors: Yi Song, San Jose, CA (US); Jiahui Yuan, Fremont, CA (US); Deepanshu Dutta, Fremont, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 166 days.

This patent is subject to a terminal disclaimer.

(21) Appl. No.: 18/224,839

(22) Filed: Jul. 21, 2023

(65) Prior Publication Data

US 2024/0282358 A1 Aug. 22, 2024

Related U.S. Application Data

(60) Provisional application No. 63/446,168, filed on Feb. 16, 2023.

(51) Int. Cl.
*G11C 11/408* (2006.01)
*G11C 5/14* (2006.01)
*G11C 11/4096* (2006.01)

(52) U.S. Cl.
CPC .......... *G11C 11/4085* (2013.01); *G11C 5/145* (2013.01); *G11C 11/4096* (2013.01)

(58) Field of Classification Search
CPC .......................... G11C 11/4085; G11C 11/408
USPC .................................................... 365/189.11
See application file for complete search history.

(56) References Cited

U.S. PATENT DOCUMENTS

| | | | | |
|---|---|---|---|---|
| 9,721,652 | B2 | 8/2017 | Puthenthermadam et al. | |
| 11,024,393 | B1 | 6/2021 | Zhang et al. | |
| 11,195,090 | B1 * | 12/2021 | Chang | G11C 13/0026 |
| 11,264,105 | B2 | 3/2022 | Yamabe et al. | |
| 11,342,033 | B1 * | 5/2022 | Song | G11C 11/5628 |
| 2010/0020621 | A1 * | 1/2010 | Doyle | G11C 29/026 365/189.06 |
| 2010/0195399 | A1 * | 8/2010 | Tanaka | G06F 12/0893 365/230.01 |
| 2020/0265898 | A1 * | 8/2020 | Hung | G11C 16/24 |
| 2022/0020424 | A1 * | 1/2022 | Yudanov | G11C 11/406 |
| 2022/0122674 | A1 | 4/2022 | Bazarsky et al. | |
| 2023/0120352 | A1 * | 4/2023 | Lien | G11C 16/24 365/185.22 |

* cited by examiner

*Primary Examiner* — Muna A Techane
(74) *Attorney, Agent, or Firm* — Dickinson Wright PLLC

(57) ABSTRACT

A storage device is disclosed. The storage device is configured to: determine data states for a first set of memory cells of a first neighboring word line of the and a second set of memory cells of a second neighboring word line, the first and the second neighboring word lines being adjacent to a selected word line; identify a zone of a plurality of zones for each data state combination of the data states, each data state combination comprising a data state of a memory cell of the first set of memory cells and a data state of a memory cell of the second set of memory cells, each zone of the plurality of zones corresponding to a bit line clamping voltage; and perform a read operation on the selected word line including applying each bit line clamping voltage corresponding to any zones identified.

17 Claims, 23 Drawing Sheets

100
108
110
State Machine, 112
On-Chip Adress Decoder, 114
Storage region, 113
Power Control, 116
124
126
storage device, 126a
Read/write circuits, 128
Sense Block, SB1
Sense Block, SB2
...
Sense Block, SBp
132
ADDR
ADDR
Data I/O
118
ROM, 122a
RAM, 122b
Processor, 122c
controller, 122
ECC Engine 245
120
Host, 140

1900

DETERMINE DATA STATES FOR A FIRST SET OF MEMORY CELLS OF A FIRST WORD LINE OF THE SET OF WORD LINES AND A SECOND SET OF MEMORY CELLS OF A SECOND WORD LINE OF THE SET OF WORD LINES, EACH OF THE DATA STATES BEING ANY OF A PLURALITY OF DATA STATES THAT THE FIRST SET AND SECOND SET OF MEMORY CELLS ARE CONFIGURED TO STORE, THE FIRST AND THE SECOND WORD LINES BEING ADJACENT TO A SELECTED WORD LINE OF THE SET OF WORD LINES

1902

IDENTIFY A ZONE OF A PLURALITY OF ZONES FOR EACH DATA STATE COMBINATION OF THE DATA STATES, EACH DATA STATE COMBINATION COMPRISING A DATA STATE OF A MEMORY CELL OF THE FIRST SET OF MEMORY CELLS AND A DATA STATE OF A MEMORY CELL OF THE SECOND SET OF MEMORY CELLS, THE MEMORY CELL OF THE FIRST SET OF MEMORY CELLS AND THE MEMORY CELL OF THE SECOND SET OF MEMORY CELLS BEING ADJACENT TO A MEMORY CELL OF A THIRD SET OF MEMORY CELLS OF THE SELECTED WORD LINE, AND WHEREIN EACH ZONE OF THE PLURALITY OF ZONES CORRESPONDS TO A BIT LINE CLAMPING VOLTAGE

1904

PERFORM A READ OPERATION ON THE SELECTED WORD LINE INCLUDING APPLYING EACH BIT LINE CLAMPING VOLTAGE CORRESPONDING TO ANY ZONES OF THE PLURALITY OF ZONES IDENTIFIED FOR THE THIRD SET OF MEMORY CELLS OF THE SELECTED WORD LINE

1906

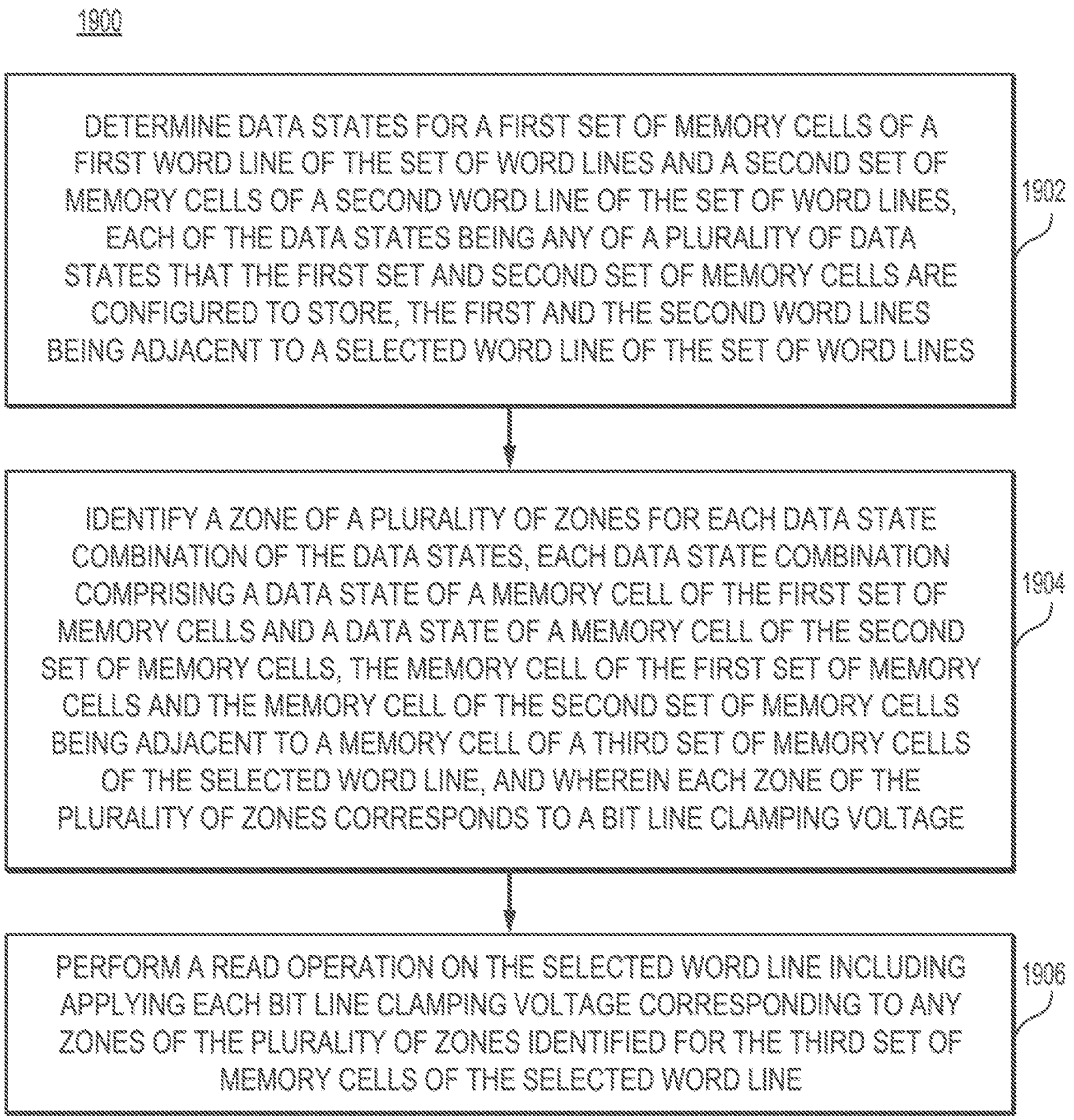

*FIG. 19*

FAST LOOK NEIGHBOR AHEAD FOR DATA RECOVERY

CROSS-REFERENCE TO RELATED APPLICATIONS

This application claims the benefit of U.S. Provisional Application No. 63/446,168, filed on Feb. 16, 2023. The entire disclosure of the application referenced above is incorporated herein by reference.

FIELD

This application relates to non-volatile memory apparatuses and the operation of non-volatile memory apparatuses.

BACKGROUND

This section provides background information related to the technology associated with the present disclosure and, as such, is not necessarily prior art.

Semiconductor memory apparatuses have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory apparatuses to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

SUMMARY

This section provides a general summary of the present disclosure and is not a comprehensive disclosure of its full scope or all of its features and advantages.

An object of the present disclosure is to provide a memory apparatus and a method of operation of the memory apparatus that address and overcome shortcomings described herein.

Accordingly, it is an aspect of the present disclosure to provide a storage device. The storage device comprises a non-volatile memory including control circuitry and an array of memory cells formed using a set of word lines and a set of bit lines, and a controller that is coupled to the non-volatile memory. The controller is configured to: determine data states for a first set of memory cells of a first word line of the set of word lines and a second set of memory cells of a second word line of the set of word lines, each of the data states being any of a plurality of data states that the first set and second set of memory cells are configured to store, the first and the second word lines being adjacent to a selected word line of the set of word lines; identify a zone of a plurality of zones for each data state combination of the data states, each data state combination comprising a data state of a memory cell of the first set of memory cells and a data state of a memory cell of the second set of memory cells, the memory cell of the first set of memory cells and the memory cell of the second set of memory cells being adjacent to a memory cell of a third set of memory cells of the selected word line, and wherein each zone of the plurality of zones corresponds to a bit line clamping voltage; and perform a read operation on the selected word line including applying each bit line clamping voltage corresponding to any zones of the plurality of zones identified for the third set of memory cells of the selected word line.

Further areas of applicability will become apparent from the description provided herein. The description and specific examples in this summary are intended for purposes of illustration only and are not intended to limit the scope of the present disclosure.

BRIEF DESCRIPTION OF THE DRAWINGS

For a detailed description of example embodiments, reference will now be made to the accompanying drawings in which:

FIG. 19 provides a method 1900 for performing a fast look neighbor ahead pre-read.

DETAILED DESCRIPTION

Figure 1B:
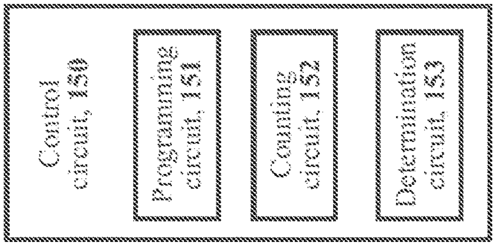
FIG. 1B is a block diagram of an example control circuit which comprises a programming circuit, a counting circuit, and a determination circuit.

In the following description, details are set forth to provide an understanding of the present disclosure. In some instances, certain circuits, structures and techniques have not been described or shown in detail in order not to obscure the disclosure.

In general, the present disclosure relates to non-volatile memory apparatuses of the type well-suited for use in many applications. The non-volatile memory apparatus and associated methods of forming of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections.

Additionally, when a layer or element is referred to as being "on" another layer or substrate, in can be directly on the other layer of substrate, or intervening layers may also be present. Further, it will be understood that when a layer is referred to as being "under" another layer, it can be directly under, and one or more intervening layers may also be present. Furthermore, when a layer is referred to as "between" two layers, it can be the only layer between the two layers, or one or more intervening layers may also be present.

A programming operation for a set of memory cells of a memory device typically involves applying a series of program voltages to the memory cells after the memory cells are provided in an erased state. Each program voltage is provided in a program loop, also referred to as a program-verify iteration. For example, the program voltage may be applied to a word line which is connected to control gates of the memory cells. In one approach, incremental step pulse programming is performed, where the program voltage is increased by a step size in each program loop. Verify operations may be performed after each program voltage to determine whether the memory cells have completed programming. When programming is completed for a memory cell, it can be locked out from further programming while programming continues for other memory cells in subsequent program loops.

Figure 9:
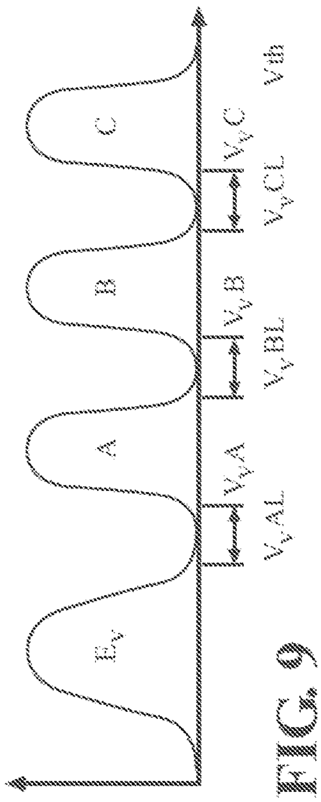
FIG. 9 depicts the Vth distributions of memory cells in an example one-pass programming operation with four data states.
Figure 10:
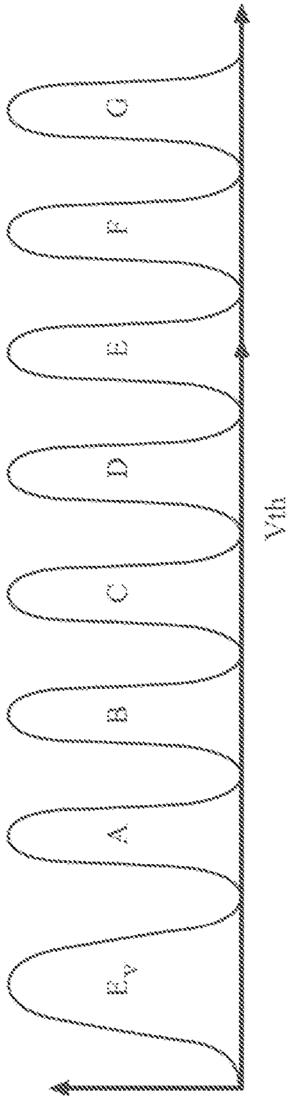
FIG. 10 depicts the Vth distributions of memory cells in an example one-pass programming operation with eight data states.
Figure 11:
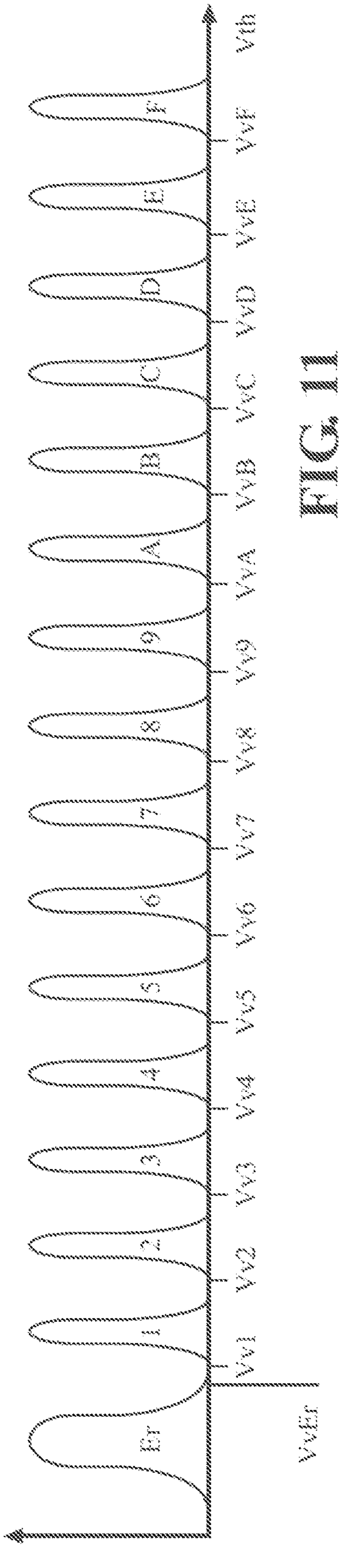
FIG. 11 depicts the Vth distributions of memory cells in an example one-pass programming operation with eight data states.

Each memory cell may be associated with a data state according to write data in a program command. Based on its data state, a memory cell will either remain in the erased state or be programmed to a data state (a programmed data state) different from the erased state. For example, in a one-bit per cell memory device (single-level cell (SLC)), there are two data states including the erased state and one higher data state. In a two-bit per cell memory device (multi-level cell (MLC)), there are four data states including the erased state and three higher data states referred to as the A, B and C data states (see FIG. 9). In a three-bit per cell memory device (triple-level cell (TLC)), there are eight data states including the erased state and seven higher data states referred to as the A, B, C, D, E, F and G data states (see FIG. 10). In a four-bit per cell memory device (quad-level cell (QLC)), there are sixteen data states including the erased state and fifteen higher data states referred to as the Er, 1, 2, 3, 4, 5, 6, 7, 8, 9, A, B, C, D, E and F data states (see FIG. 11). Each memory cell may store a data state (e.g., a binary value) and is programmed to a threshold voltage state corresponding to the data state. Each state represents a different value and is assigned a voltage window including a range of possible threshold voltages.

When a program command is issued, the write data is stored in latches associated with the memory cells. During programming, the latches of a memory cell can be read to determine the data state to which the cell is to be programmed. Each programmed data state is associated with a verify voltage such that a memory cell with a given data state is considered to have completed programming when a sensing operation determines its threshold voltage (Vth) is above the associated verify voltage. A sensing operation can determine whether a memory cell has a Vth above the associated verify voltage by applying the associated verify voltage to the control gate and sensing a current through the memory cell. If the current is relatively high, this indicates the memory cell is in a conductive state, such that the Vth is less than the control gate voltage. If the current is relatively low, this indicates the memory cell is in a non-conductive state, such that the Vth is above the control gate voltage.

The verify voltage which is used to determine that a memory cell has completed programming may be referred to as a final or lockout verify voltage. In some cases, an additional verify voltage may be used to determine that a memory cell is close to completion of the programming. This additional verify voltage may be referred to as an offset verify voltage, and may be lower than the final verify voltage. When a memory cell is close to completion of programming, the programming speed of the memory cell may be reduced such as by elevating a voltage of a respective bit line during one or more subsequent program voltages. For example, in FIG. 9, a memory cell which is to be programmed to the A data state may be subject to verify tests at VvAL, an offset verify voltage of the A data state, and VvA, a final verify voltage of the A data state.

However, technological improvements have reduced the size of memory circuitry and related hardware, thereby making it difficult to efficiently program the memory cells. For example, by decreasing the size of memory circuitry and related hardware, more memory cells may be placed within a memory architecture. The silicon oxide and silicon nitride ("ON") pitch shrinking that occurs reduces the amount of physical space between word lines. Consequently, when a memory cell is programmed, neighbor word line interference (NWI) from a neighboring memory cell may impact the program-verify operation, such that additional program-verify iterations are needed to complete programming of the memory cells.

More specifically, the trend of shrinking ON pitch from generation to generation of BiCS NAND has caused the cell effective gate length and word line-word line distance to decrease. As a result, NWI has worsened and the Vth margin has degraded. With conventional full sequence program scheme, the memory cell with a neighboring word line (i.e., WLn+1) in high states has a higher Vth due to the NWI effect and such effect is stronger in narrower ON pitch memory cells. Furthermore, during high temperature data retention (HTDR), Vth shifts down more for those memory cells with low Vth neighbors as compared with memory cells with high Vth neighbors. As such, the Vth distribution further widens after data retention and such effect (because of lateral charge movement) is worse in narrow ON pitch memory cells.

To help further illustrate the foregoing, FIG. 1A will now be described. FIG. 1A is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided, e.g., for verify parameters as described herein.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The control circuits can include a programming circuit configured to program memory cells of a word line of a block and verify the set of the memory cells. The control circuits can also include a counting circuit configured to determine a number of memory cells that are verified to be in a data state. The control circuits can also include a determination circuit configured to determine, based on the number, whether the block is faulty.

Figure 1A:
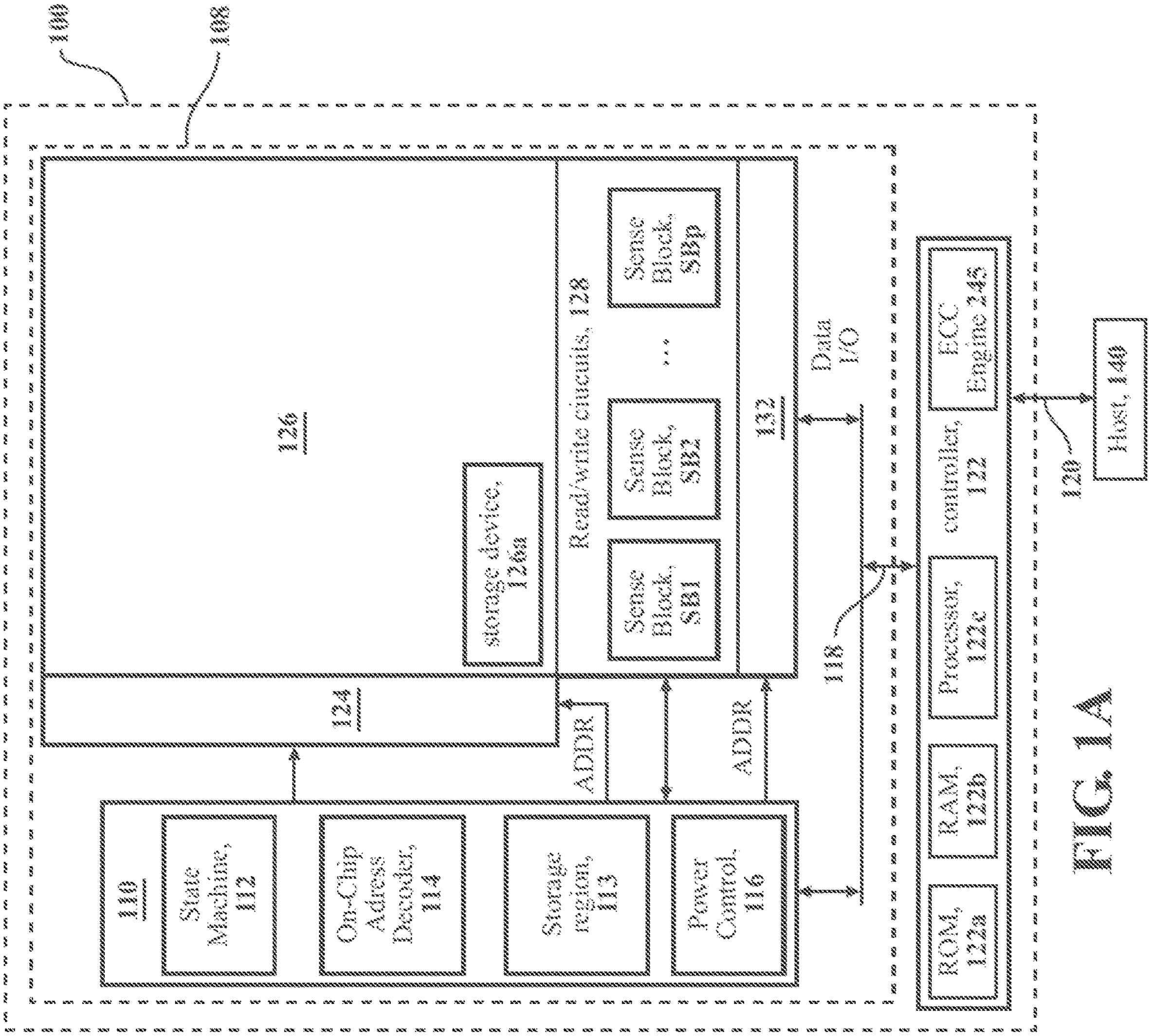
FIG. 1A is a block diagram of an example memory device.

For example, FIG. 1B is a block diagram of an example control circuit 150 which comprises a programming circuit 151, a counting circuit 152 and a determination circuit 153. The programming circuit may include software, firmware and/or hardware. The counting circuit may include software, firmware and/or hardware. The determination circuit may include software, firmware and/or hardware.

The off-chip controller 122 may comprise a processor 122*c*, storage devices (memory) such as ROM 122*a* and RAM 122*b* and an error-correction code (ECC) engine 245. The ECC engine can correct a number of read errors which are caused when the upper tail of a Vth distribution becomes too high. However, uncorrectable errors may exists in some cases. The techniques provided herein reduce the likelihood of uncorrectable errors.

The storage device comprises code such as a set of instructions, and the processor is operable to execute the set of instructions to provide the functionality described herein. Alternatively or additionally, the processor can access code from a storage device 126*a* of the memory structure, such as a reserved area of memory cells in one or more word lines.

For example, code can be used by the controller 122 to access the memory structure such as for programming, read and erase operations. The code can include boot code and control code (e.g., set of instructions). The boot code is software that initializes the controller during a booting or startup process and enables the controller to access the memory structure. The code can be used by the controller to control one or more memory structures. Upon being powered up, the processor 122*c* fetches the boot code from the ROM 122*a* or storage device 126*a* for execution, and the boot code initializes the system components and loads the control code into the RAM 122*b*. Once the control code is loaded into the RAM, it is executed by the processor. The control code includes drivers to perform basic tasks such as controlling and allocating memory, prioritizing the processing of instructions, and controlling input and output ports.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

Figure 2:
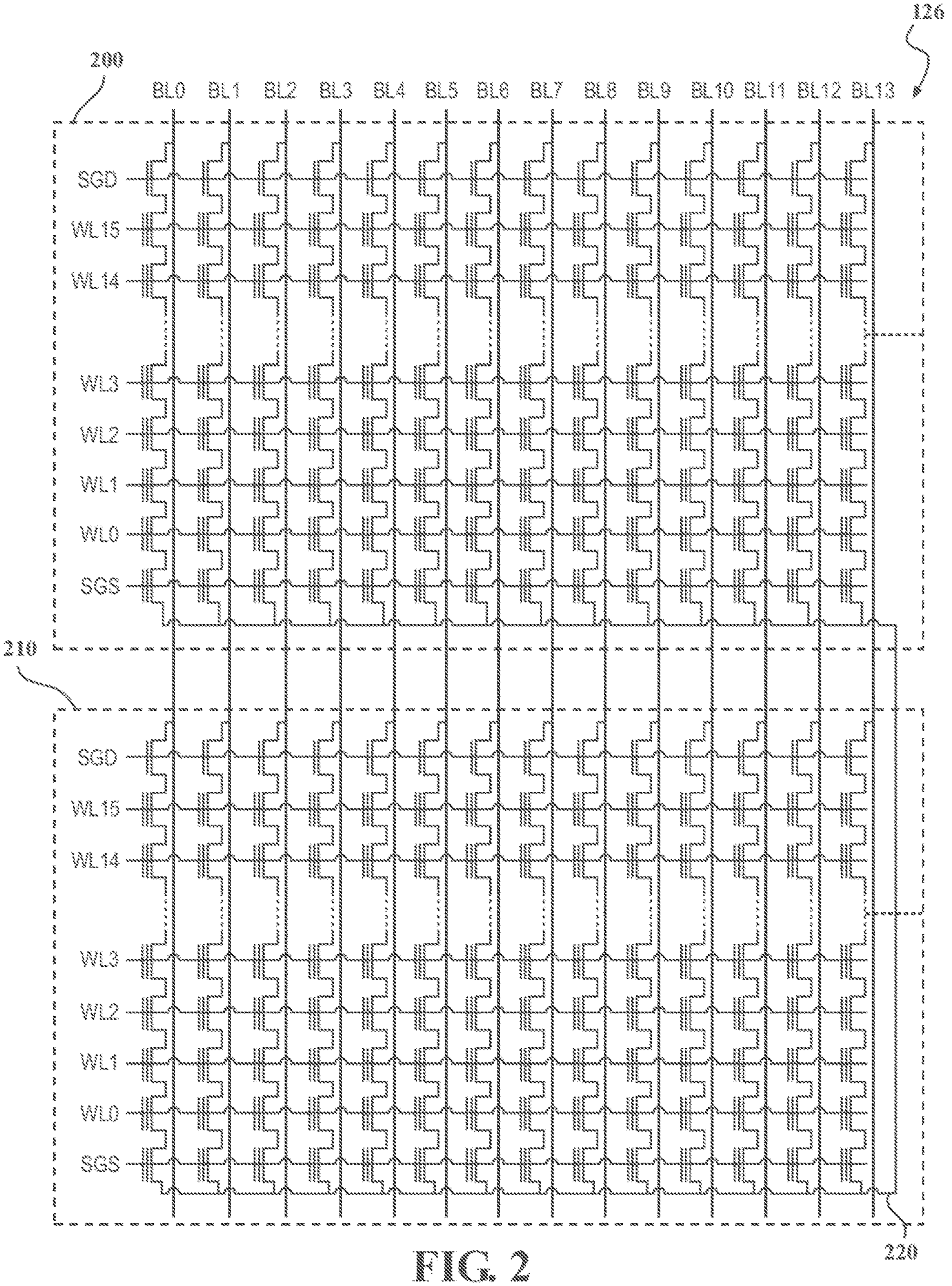
FIG. 2 depicts blocks of memory cells in an example two-dimensional configuration of the memory array of FIG. 1.

FIG. 2 depicts blocks of memory cells in an example two-dimensional configuration of the memory array 126 of FIG. 1. The memory array can include many blocks. Each example block 200, 210 includes a number of NAND strings and respective bit lines, e.g., BL0, BL1, . . . which are shared among the blocks. Each NAND string is connected at one end to a drain select gate (SGD), and the control gates of the drain select gates are connected via a common SGD line. The NAND strings are connected at their other end to a source select gate which, in turn, is connected to a common source line 220. Sixteen word lines, for example, WL0-WL15, extend between the source select gates and the drain select gates. In some cases, dummy word lines, which contain no user data, can also be used in the memory array adjacent to the select gate transistors. Such dummy word lines can shield the edge data word line from certain edge effects.

One type of non-volatile memory which may be provided in the memory array is a floating gate memory. See FIGS. 3A and 3B. Other types of non-volatile memory can also be used. For example, a charge-trapping memory cell uses a non-conductive dielectric material in place of a conductive floating gate to store charge in a non-volatile manner. See FIGS. 4A and 4B. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Figure 3A:
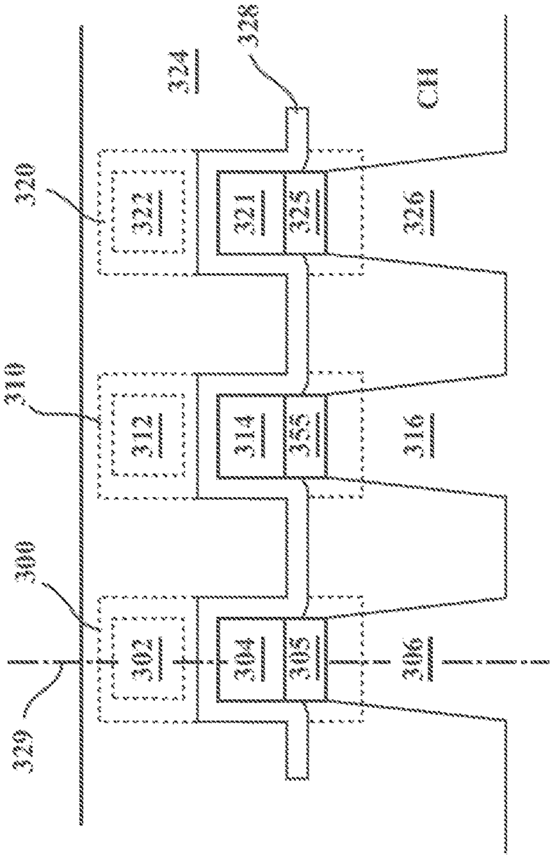
FIG. 3A depicts a cross-sectional view of example floating gate memory cells in NAND strings.

FIG. 3A depicts a cross-sectional view of example floating gate memory cells in NAND strings. A bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell is in a different respective NAND string. An inter-poly dielectric (IPD) layer 328 is also depicted. The control gates are portions of the word line. A cross-sectional view along line 329 is provided in FIG. 3B.

Figure 4A:
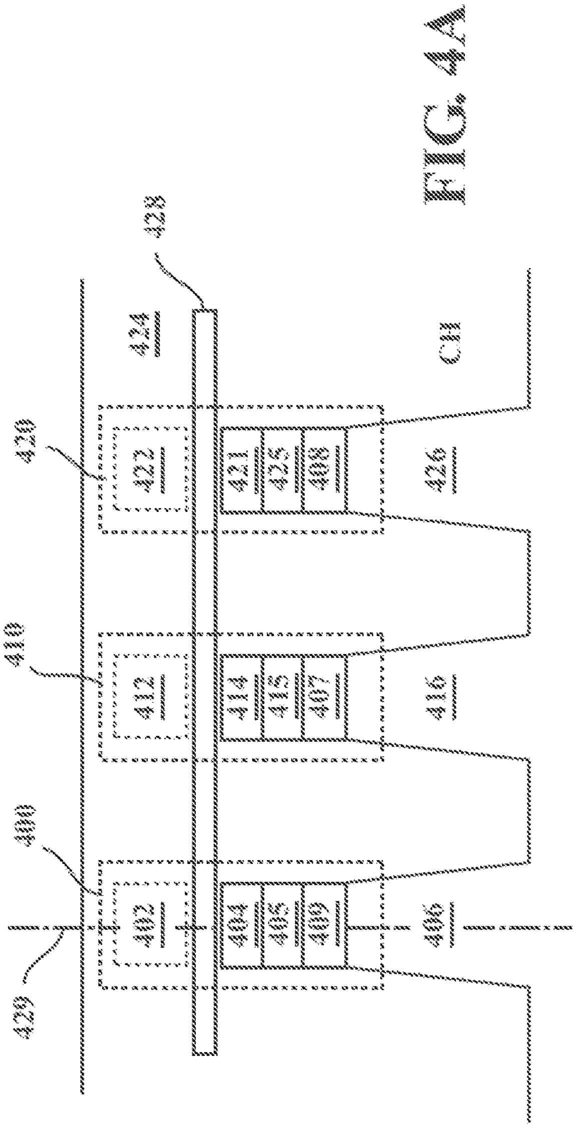
FIG. 4A depicts a cross-sectional view of example charge-trapping memory cells in NAND strings.
Figure 4B:
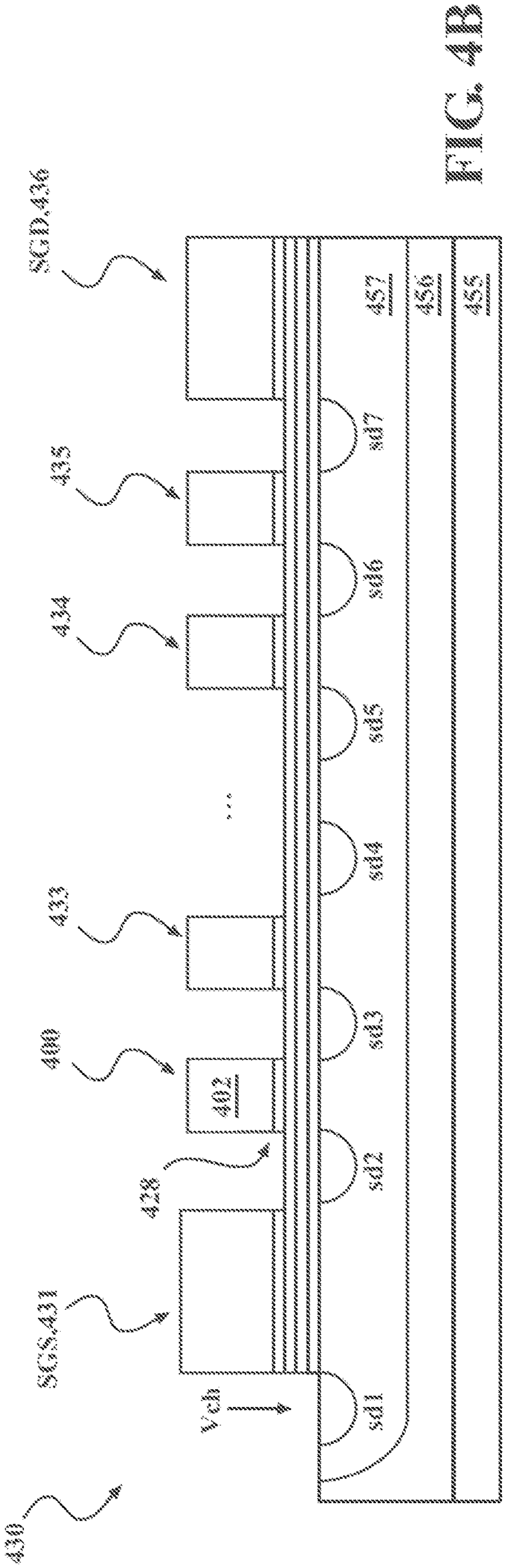
FIG. 4B depicts a cross-sectional view of the structure of FIG. 4A along line 429.

The control gate wraps around the floating gate, increasing the surface contact area between the control gate and floating gate. This results in higher IPD capacitance, leading to a higher coupling ratio which makes programming and erase easier. However, as NAND memory devices are scaled down, the spacing between neighboring cells becomes smaller so there is almost no space for the control gate and the IPD between two adjacent floating gates. As an alternative, as shown in FIGS. 4A and 4B, the flat or planar memory cell has been developed in which the control gate is flat or planar; that is, it does not wrap around the floating gate, and its only contact with the charge storage layer is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

Figure 3B:
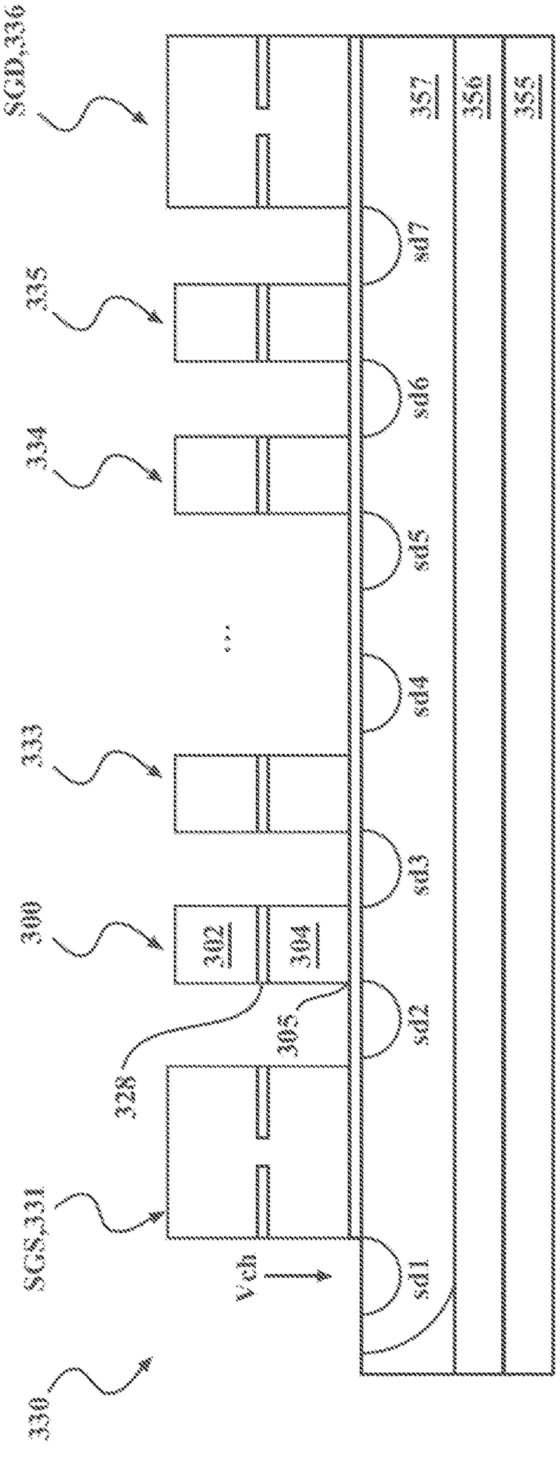
FIG. 3B depicts a cross-sectional view of the structure of FIG. 3A along line 329.

FIG. 3B depicts a cross-sectional view of the structure of FIG. 3A along line 329. The NAND string 330 includes an SGS transistor 331, example memory cells 300, 333, . . . , 334 and 335, and an SGD transistor 336. The memory cell 300, as an example of each memory cell, includes the control gate 302, the IPD layer 328, the floating gate 304 and the tunnel oxide layer 305, consistent with FIG. 3A. Passageways in the IPD layer in the SGS and SGD transistors allow the control gate layers and floating gate layers to communicate. The control gate and floating gate layers may be polysilicon and the tunnel oxide layer may be silicon oxide, for instance. The IPD layer can be a stack of nitrides (N) and oxides (O) such as in a N—O—N—O—N configuration.

The NAND string may be formed on a substrate which comprises a p-type substrate region 355, an n-type well 356 and a p-type well 357. N-type source/drain diffusion regions sd1, sd2, sd3, sd4, sd5, sd6 and sd7 are formed in the p-type well. A channel voltage, Vch, may be applied directly to the channel region of the substrate.

FIG. 4A depicts a cross-sectional view of example charge-trapping memory cells in NAND strings. The view is in a word line direction of memory cells comprising a flat control gate and charge-trapping regions as a 2D example of memory cells in the memory cell array 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line (WL) 424 extends across NAND strings which include respective channel regions 406, 416 and 426. Portions of the word line provide control gates 402, 412 and 422. Below the word line is an IPD layer 428, charge-trapping layers 404, 414 and 421, polysilicon layers 405, 415 and 425 and tunneling layer layers 409, 407 and 408. Each charge-trapping layer extends continuously in a respective NAND string.

A memory cell 400 includes the control gate 402, the charge-trapping layer 404, the polysilicon layer 405 and a portion of the channel region 406. A memory cell 410 includes the control gate 412, the charge-trapping layer 414, a polysilicon layer 415 and a portion of the channel region 416. A memory cell 420 includes the control gate 422, the charge-trapping layer 421, the polysilicon layer 425 and a portion of the channel region 426.

A flat control gate is used here instead of a control gate that wraps around a floating gate. One advantage is that the charge-trapping layer can be made thinner than a floating gate. Additionally, the memory cells can be placed closer together.

FIG. 4B depicts a cross-sectional view of the structure of FIG. 4A along line 429. The view shows a NAND string 430 having a flat control gate and a charge-trapping layer. The NAND string 430 includes an SGS transistor 431, example memory cells 400, 433, . . . , 434 and 435, and an SGD transistor 435.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well 457. A channel voltage, Vch, may be applied directly to the channel region of the substrate. The memory cell 400 includes the control gate 402 and the IPD layer 428 above the charge-trapping layer 404, the polysilicon layer 405, the tunneling layer 409 and the channel region 406.

The control gate layer may be polysilicon and the tunneling layer may be silicon oxide, for instance. The IPD layer can be a stack of high-k dielectrics such as AlOx or HfOx which help increase the coupling ratio between the control gate layer and the charge-trapping or charge storing layer. The charge-trapping layer can be a mix of silicon nitride and oxide, for instance.

The SGD and SGS transistors have the same configuration as the memory cells but with a longer channel length to ensure that current is cutoff in an inhibited NAND string.

In this example, the layers 404, 405 and 409 extend continuously in the NAND string. In another approach, portions of the layers 404, 405 and 409 which are between the control gates 402, 412 and 422 can be removed, exposing a top surface of the channel 406.

Figure 5A:
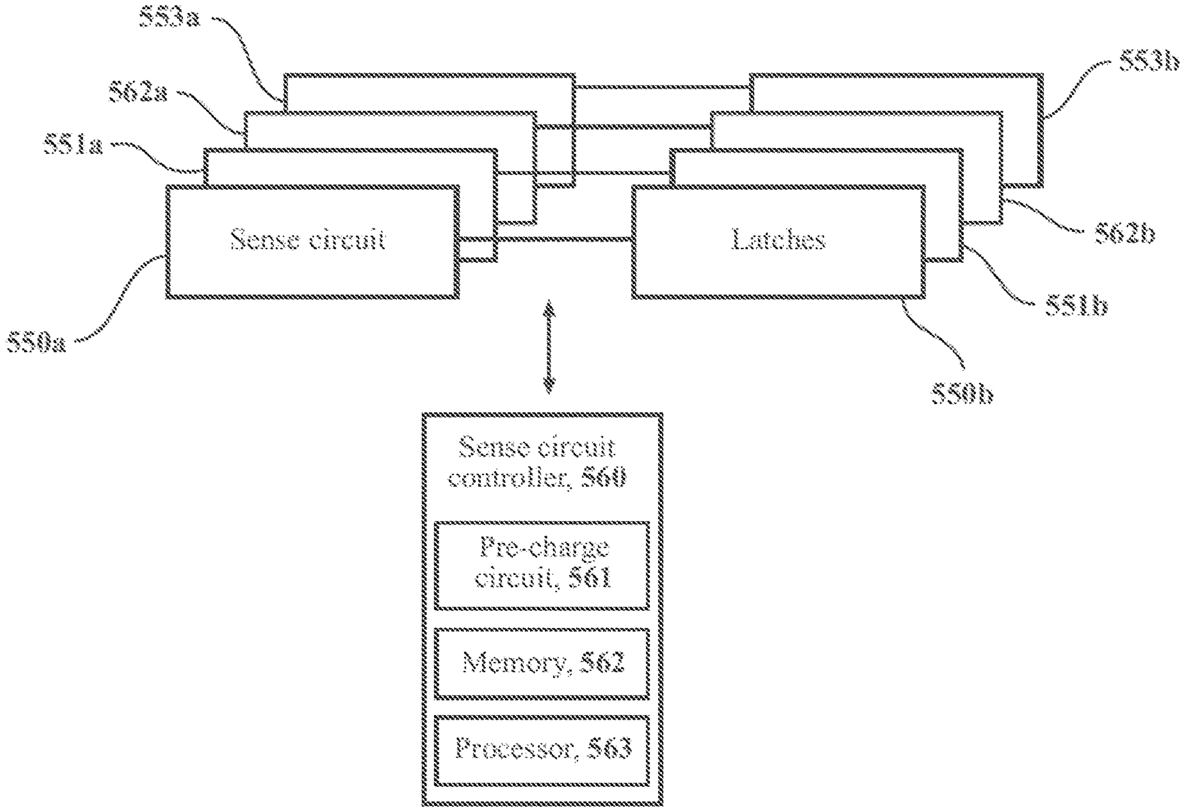
FIG. 5A depicts an example block diagram of the sense block SB1 of FIG. 1.

FIG. 5A depicts an example block diagram of the sense block SB1 of FIG. 1. In one approach, a sense block comprises multiple sense circuits. Each sense circuit is associated with data latches. For example, the example sense circuits 550*a*, 551*a*, 552*a* and 553*a* are associated with the data latches 550*b*, 551*b*, 552*b* and 553*b*, respectively. In one approach, different subsets of bit lines can be sensed using different respective sense blocks. This allows the processing load which is associated with the sense circuits to be divided up and handled by a respective processor in each sense block. For example, a sense circuit controller 560 in SB1 can communicate with the set of sense circuits and latches. The sense circuit controller may include a pre-charge circuit 561 which provides a voltage to each sense circuit for setting a pre-charge voltage. In one possible approach, the voltage is provided to each sense circuit independently, e.g., via the data base 503 and a local bus such as LBUS1 or LBUS2 in FIG. 5B. In another possible approach, a common voltage is provided to each sense circuit concurrently, e.g., via the line 505 in FIG. 5B. The sense circuit controller may also include a memory 562 and a processor 563. As mentioned also in connection with FIG. 2, the memory 562 may store code which is executable by the processor to perform the functions described herein. These functions can include reading latches which are associated with the sense circuits, setting bit values in the latches and providing voltages for setting pre-charge levels in sense nodes of the sense circuits. Further example details of the sense circuit controller and the sense circuits 550*a* and 551*a* are provided below.

Figure 5B:
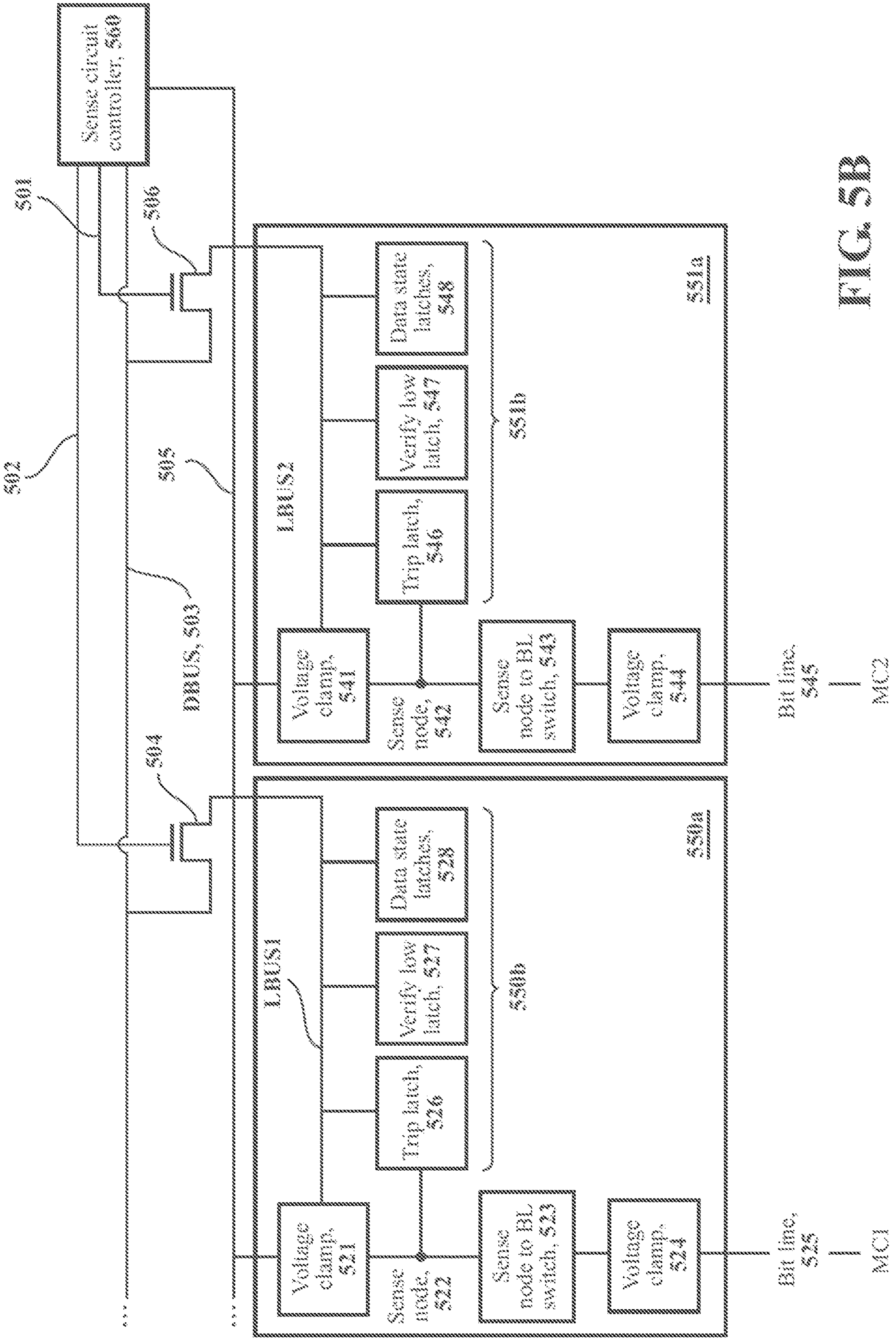
FIG. 5B depicts another example block diagram of the sense block SB1 of FIG. 1.

FIG. 5B depicts another example block diagram of the sense block SB1 of FIG. 1. The sense circuit controller 560 communicates with multiple sense circuits including example sense circuits 550*a* and 551*a*, also shown in FIG. 5A. The sense circuit 550*a* includes latches 550*b*, including a trip latch 526, an offset verify latch 527 and data state latches 528. The sense circuit further includes a voltage clamp 521 such as a transistor which sets a pre-charge voltage at a sense node 522. A sense node to bit line (BL) switch 523 selectively allows the sense node to communicate with a bit line 525, e.g., the sense node is electrically connected to the bit line so that the sense node voltage can decay. The bit line 525 is connected to one or more memory cells such as a memory cell MC1. A voltage clamp 524 can set a voltage on the bit line, such as during a sensing operation or during a program voltage. A local bus, LBUS1, allows the sense circuit controller to communicate with components in the sense circuit, such as the latches 550*b* and the voltage clamp in some cases. To communicate with the sense circuit 550*a*, the sense circuit controller provides a voltage via a line 502 to a transistor 504 to connect LBUS1 with a data bus DBUS, 503. The communicating can include sending data to the sense circuit and/or receive data from the sense circuit.

The sense circuit controller can communicate with different sense circuits in a time-multiplexed manner, for instance. A line 505 may be connected to the voltage clamp in each sense circuit, in one approach.

The sense circuit 551*a* includes latches 551*b*, including a trip latch 546, an offset verify latch 547 and data state latches 548. A voltage clamp 541 may be used to set a pre-charge voltage at a sense node 542. A sense node to bit line (BL) switch 543 selectively allows the sense node to communicate with a bit line 545, and a voltage clamp 544 can set a voltage on the bit line. The bit line 545 is connected to one or more memory cells such as a memory cell MC2. A local bus, LBUS2, allows the sense circuit controller to communicate with components in the sense circuit, such as the latches 551*b* and the voltage clamp in some cases. To communicate with the sense circuit 551*a*, the sense circuit controller provides a voltage via a line 501 to a transistor 506 to connect LBUS2 with DBUS.

The sense circuit 550*a* may be a first sense circuit which comprises a first trip latch 526 and the sense circuit 551*a* may be a second sense circuit which comprises a second trip latch 546.

The sense circuit 550*a* is an example of a first sense circuit comprising a first sense node 522, where the first sense circuit is associated with a first memory cell MC1 and a first bit line 525. The sense circuit 551*a* is an example of a second sense circuit comprising a second sense node 542, where the second sense circuit is associated with a second memory cell MC2 and a second bit line 545.

Figure 6A:
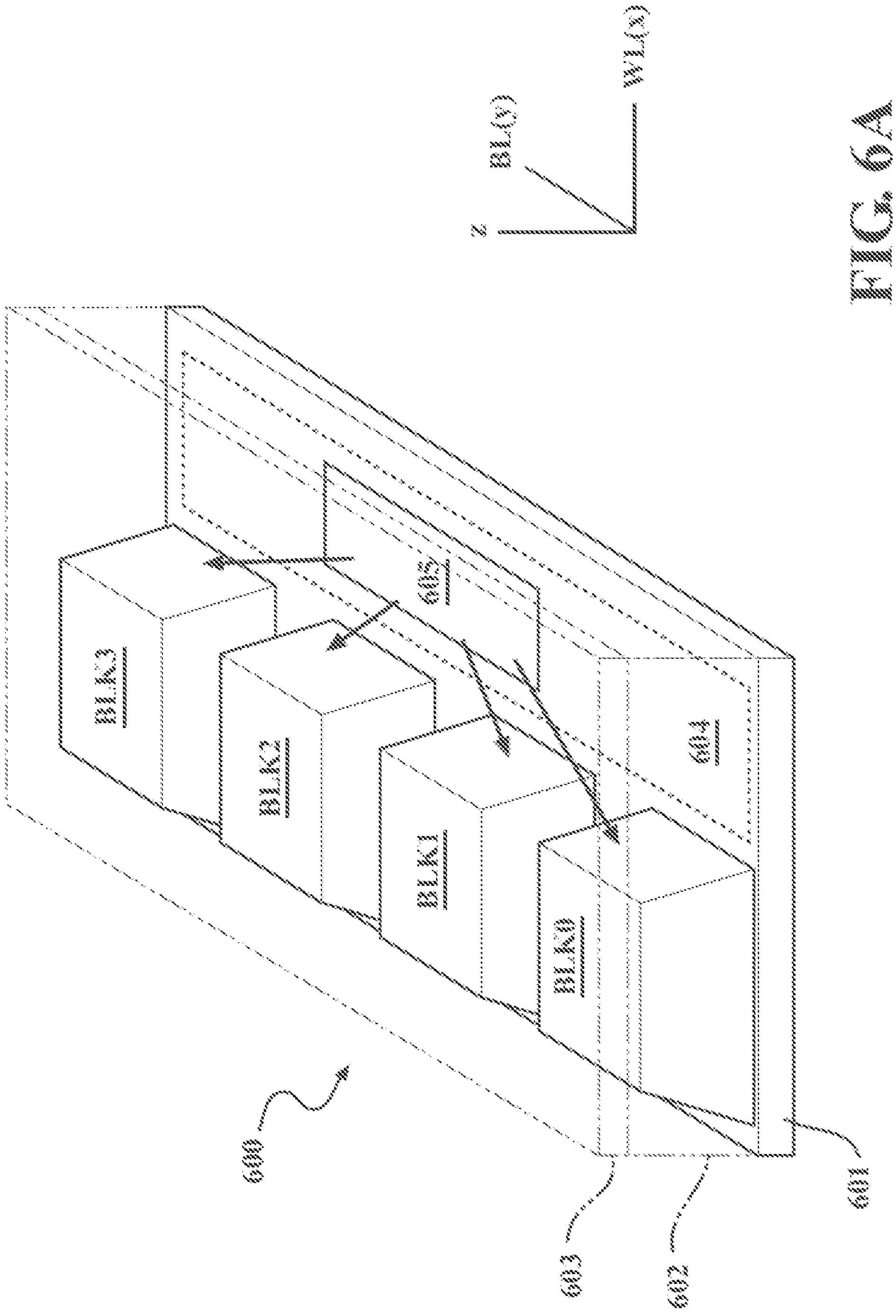
FIG. 6A is a perspective view of a set of blocks in an example three-dimensional configuration of the memory array of FIG. 1.

FIG. 6A is a perspective view of a set of blocks 600 in an example three-dimensional configuration of the memory array 126 of FIG. 1. On the substrate are example blocks BLK0, BLK1, BLK2 and BLK3 of memory cells (storage elements) and a peripheral area 604 with circuitry for use by the blocks. For example, the circuitry can include voltage drivers 605 which can be connected to control gate layers of the blocks. In one approach, control gate layers at a common height in the blocks are commonly driven. The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
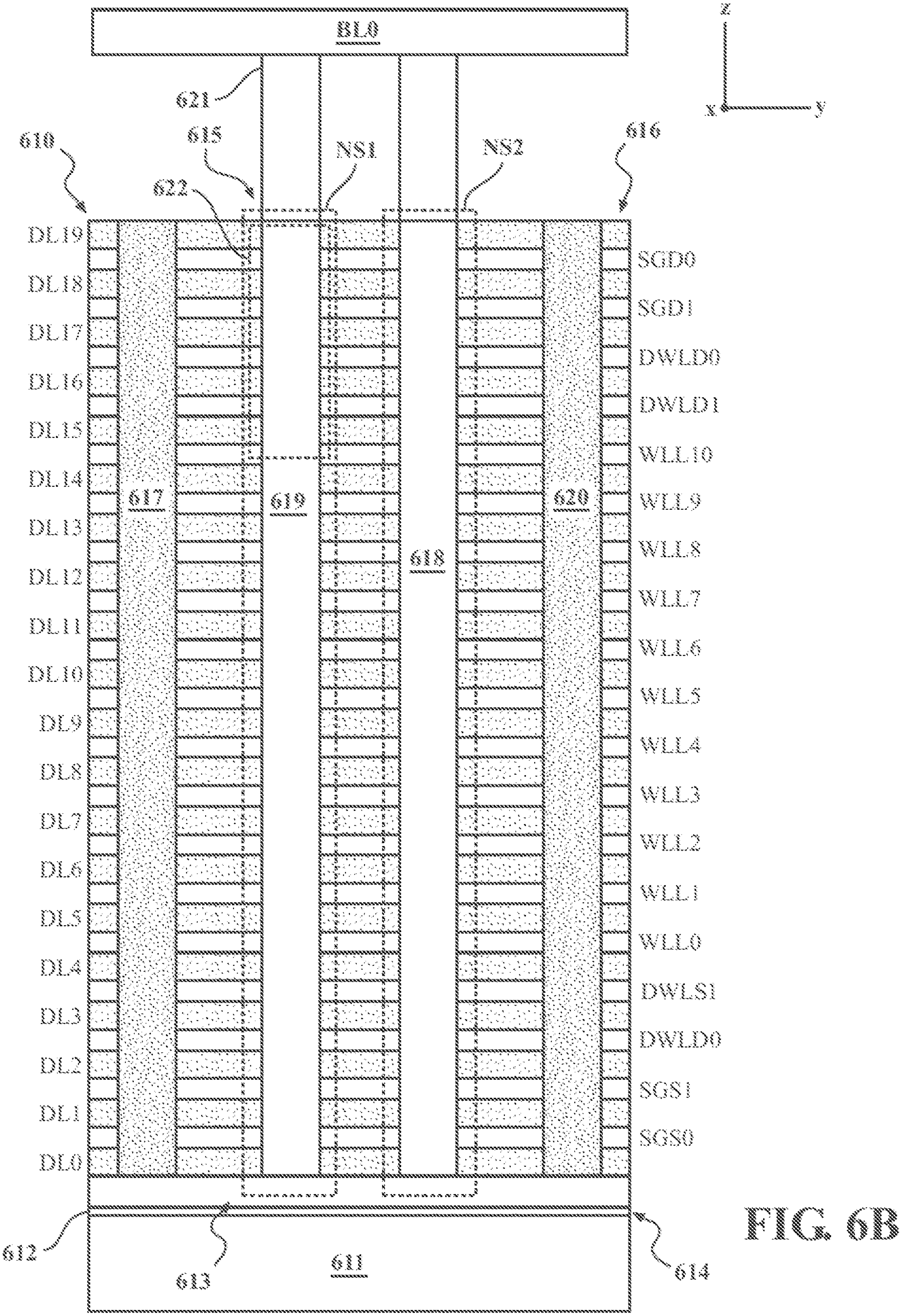
FIG. 6B depicts an example cross-sectional view of a portion of one of the blocks of FIG. 6A.

FIG. 6B depicts an example cross-sectional view of a portion of one of the blocks of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 6D.

The stack includes a substrate 611, an insulating film 612 on the substrate, and a portion of a source line SL. NS1 has a source-end 613 at a bottom 614 of the stack and a drain-end 615 at a top 616 of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

Figure 6C:
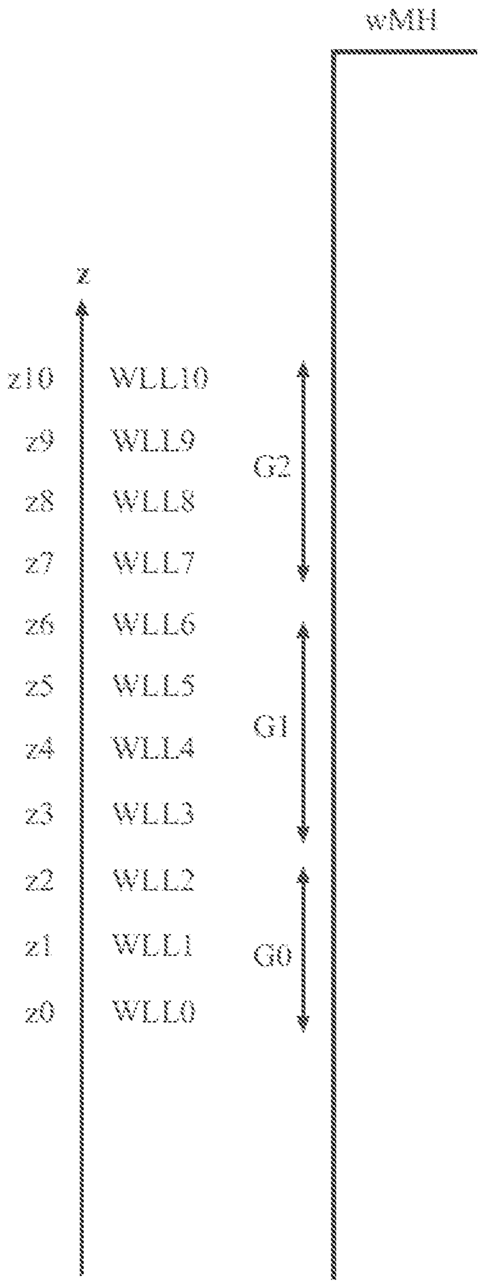
FIG. 6C depicts a plot of memory hole diameter in the stack of FIG. 6B.

FIG. 6C depicts a plot of memory hole diameter in the stack of FIG. 6B. The vertical axis is aligned with the stack of FIG. 6B and depicts a width (wMH), e.g., diameter, of the memory holes 618 and 619. The word line layers WLL0-WLL10 of FIG. 6A are repeated as an example and are at respective heights z0-z10 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes.

Figure 6D:
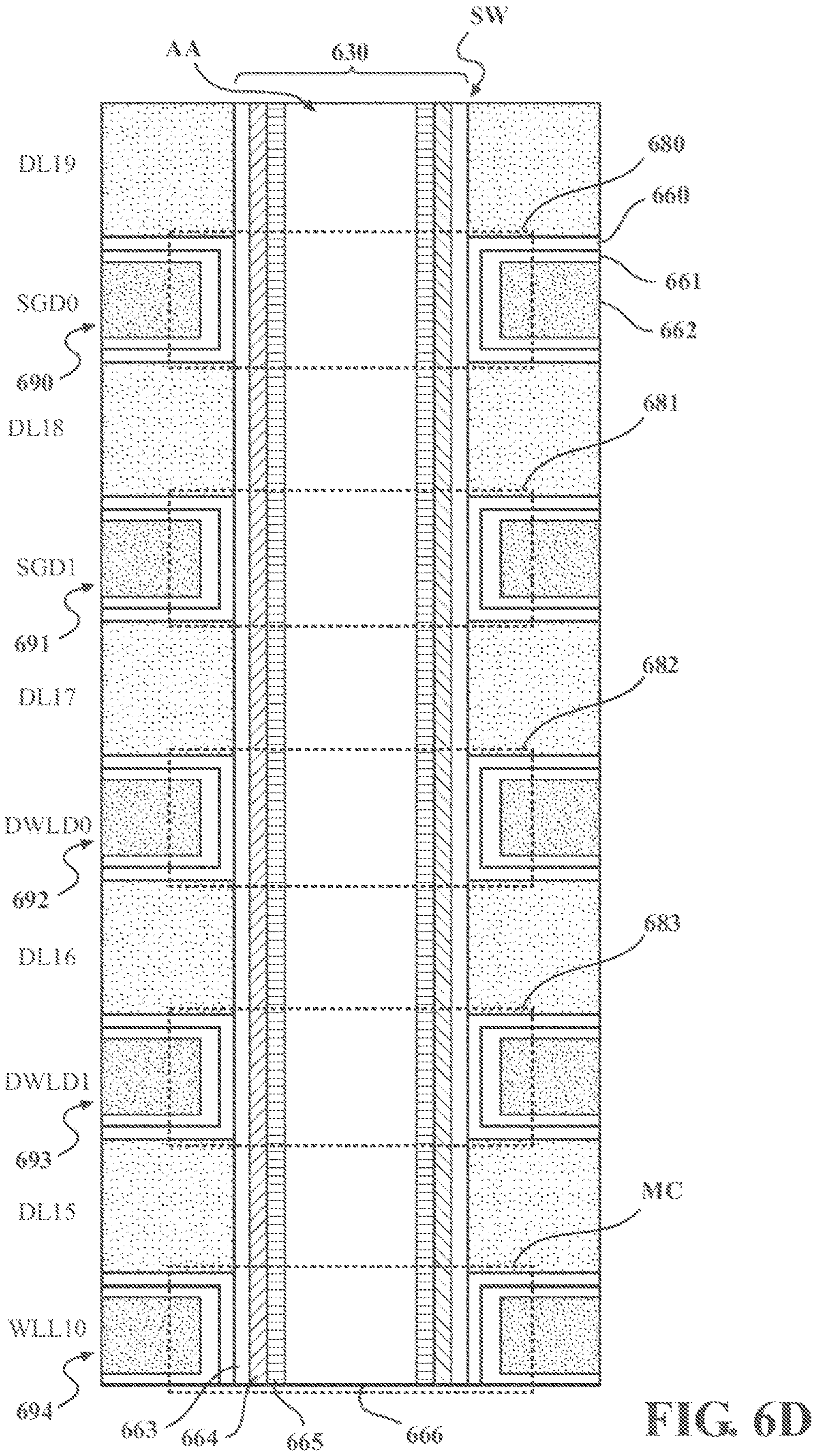
FIG. 6D depicts a close-up view of the region 622 of the stack of FIG. 6B.

FIG. 6D depicts a close-up view of the region 622 of the stack of FIG. 6B. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 7A:
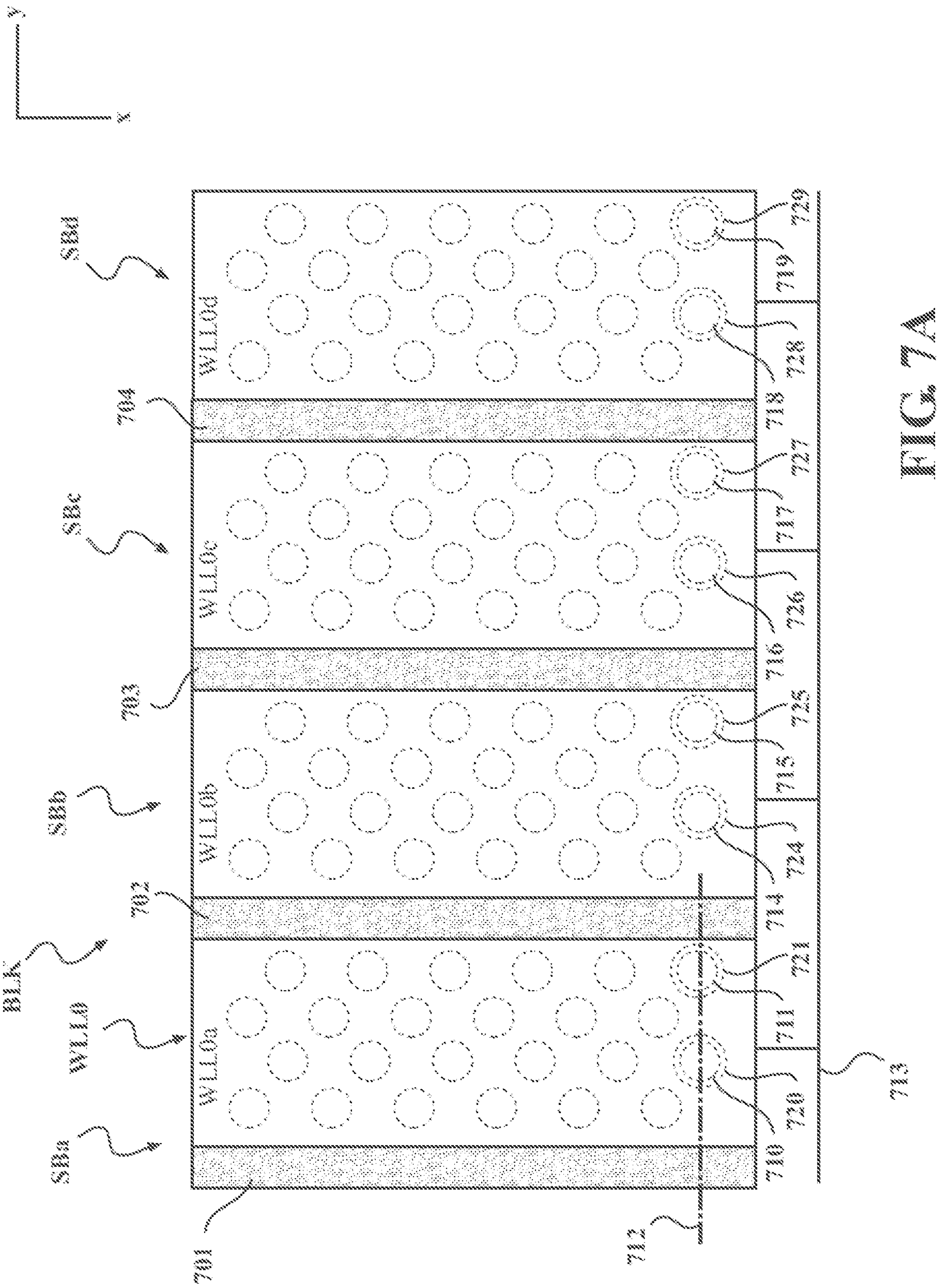
FIG. 7A depicts a top view of an example word line layer WLL0 of the stack of FIG. 6B.

FIG. 7A depicts a top view of an example word line layer WLL0 of the stack of FIG. 6B. As mentioned, a 3D memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a 3D memory device can be divided into sub-blocks, where each sub-block comprises a set of NAND string which have a common SGD control line. For example, see the SGD lines/control gates SGD0, SGD1, SGD2 and SGD3 in the sub-blocks SBa, SBb, SBc and SBd, respectively. The sub-blocks SBa, SBb, SBc and SBd may also be referred herein as a string of memory cells of a word line. As described, a string of memory cells of a word line may include a plurality of memory cells that are part of the same sub-block, and that are also disposed in the same word line layer and/or that are configured to have their control gates biased by the same word line and/or with the same word line voltage.

Further, a word line layer in a block can be divided into regions. Each region is in a respective sub-block are can extend between slits which are formed periodically in the stack to process the word line layers during the fabrication process of the memory device. This processing can include replacing a sacrificial material of the word line layers with metal. Generally, the distance between slits should be relatively small to account for a limit in the distance that an etchant can travel laterally to remove the sacrificial material, and that the metal can travel to fill a void which is created by the removal of the sacrificial material. For example, the distance between slits may allow for a few rows of memory holes between adjacent slits. The layout of the memory holes and slits should also account for a limit in the number of bit lines which can extend across the region while each bit line is connected to a different memory cell. After processing the word line layers, the slits can optionally be filed with metal to provide an interconnect through the stack.

This figures and other are not necessarily to scale. In practice, the regions can be much longer in the x-direction relative to the y-direction than is depicted to accommodate additional memory holes.

Figure 7B:
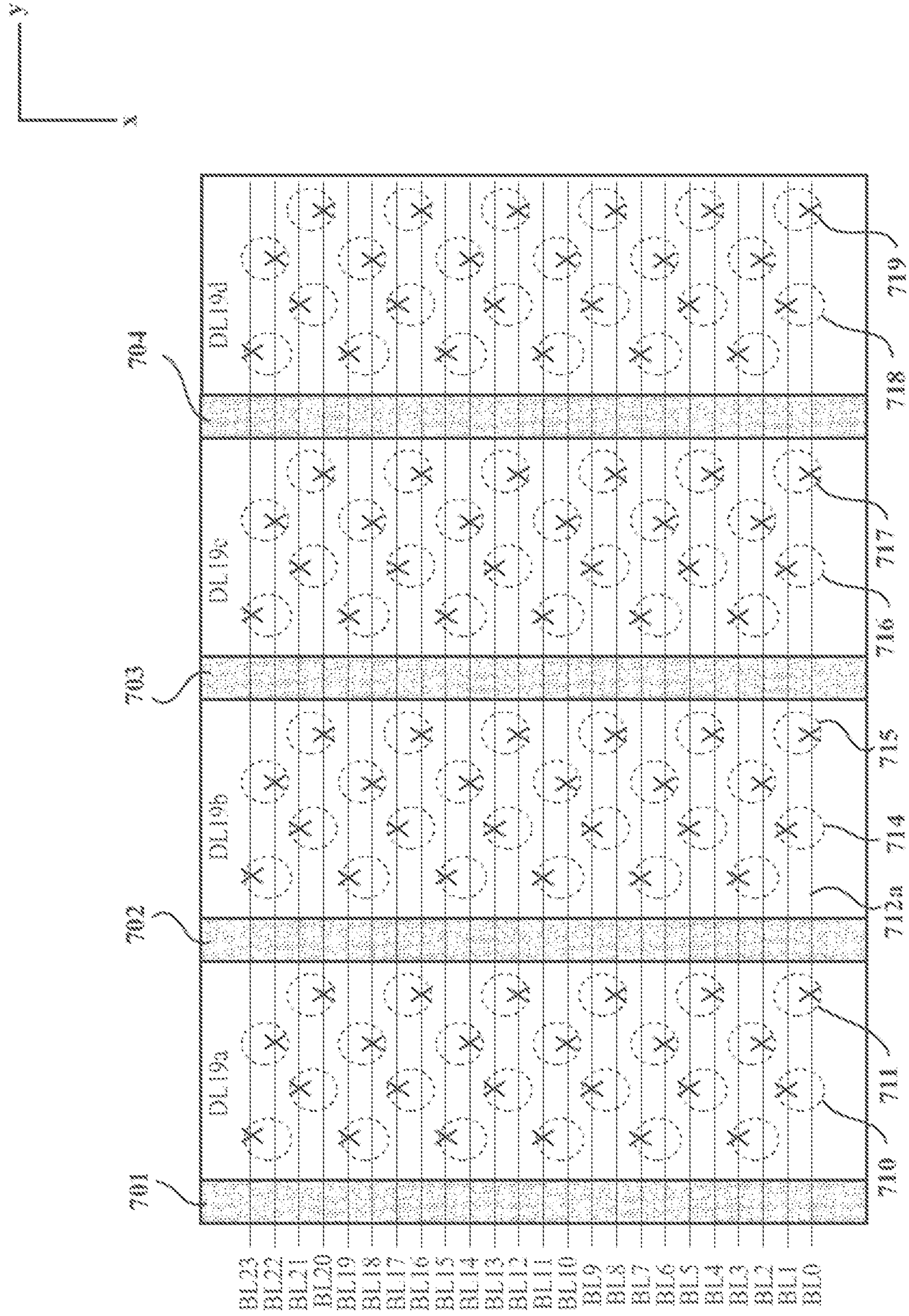
FIG. 7B depicts a top view of an example top dielectric layer DL19 of the stack of FIG. 6B.

In this example, there are four rows of memory holes between adjacent slits. A row here is a group of memory holes which are aligned in the x-direction. Moreover, the rows of memory holes are in a staggered pattern to increase the density of the memory holes. The word line layer or word line is divided into regions WLL0*a*, WLL0*b*, WLL0*c* and WLL0*d* which are each connected by a connector 713. The last region of a word line layer in a block can be connected to a first region of a word line layer in a next block, in one approach. The connector, in turn, is connected to a voltage driver for the word line layer. The region WLL0*a* has example memory holes 710 and 711 along a line 712. The region WLL0*b* has example memory holes 714 and 715. The region WLL0*c* has example memory holes 716 and 717. The region WLL0*d* has example memory holes 718 and 719. The memory holes are also shown in FIG. 7B. Each memory hole can be part of a respective NAND string. For example, the memory holes 710, 714, 716 and 718 can be part of NAND strings NS0_SBa, NS0_SBb, NS0_SBc and NS0_SBd, respectively.

Each circle represents the cross-section of a memory hole at a word line layer or SG layer. Example circles shown with dashed lines represent memory cells which are provided by the materials in the memory hole and by the adjacent word line layer. For example, memory cells 720 and 721 are in WLL0*a*, memory cells 724 and 725 are in WLL0*b*, memory cells 726 and 727 are in WLL0*c*, and memory cells 728 and 729 are in WLL0*d*. These memory cells are at a common height in the stack.

Metal-filled slits 701, 702, 703 and 704 (e.g., metal interconnects) may be located between and adjacent to the edges of the regions WLL0*a*-WLL0*d*. The metal-filled slits provide a conductive path from the bottom of the stack to the top of the stack. For example, a source line at the bottom of the stack may be connected to a conductive line above the stack, where the conductive line is connected to a voltage driver in a peripheral region of the memory device. See also FIG. 8A for further details of the sub-blocks SBa-SBd of FIG. 7A.

FIG. 7B depicts a top view of an example top dielectric layer DL19 of the stack of FIG. 6B. The dielectric layer is divided into regions DL19*a*, DL19*b*, DL19*c* and DL19*d*. Each region can be connected to a respective voltage driver. This allows a set of memory cells in one region of a word line layer to be programmed concurrently, with each memory cell being in a respective NAND string which is connected to a respective bit line. A voltage can be set on each bit line to allow or inhibit programming during each program voltage.

The region DL19*a* has the example memory holes 710 and 711 along a line 712*a* which is coincident with a bit line BL0. A number of bit lines extend above the memory holes and are connected to the memory holes as indicated by the "X" symbols. BL0 is connected to a set of memory holes which includes the memory holes 711, 715, 717 and 719. Another example bit line BL1 is connected to a set of memory holes which includes the memory holes 710, 714, 716 and 718. The metal-filled slits 701, 702, 703 and 704 from FIG. 7A are also depicted, as they extend vertically through the stack. The bit lines can be numbered in a sequence BL0-BL23 across the DL19 layer in the −x direction.

Different subsets of bit lines are connected to cells in different rows. For example, BL0, BL4, BL8, BL12, BL16 and BL20 are connected to cells in a first row of cells at the right hand edge of each region. BL2, BL6, BL10, BL14, BL18 and BL22 are connected to cells in an adjacent row of cells, adjacent to the first row at the right hand edge. BL3, BL7, BL11, BL15, BL19 and BL23 are connected to cells in a first row of cells at the left hand edge of each region. BL1, BL5, BL9, BL13, BL17 and BL21 are connected to cells in an adjacent row of cells, adjacent to the first row at the left hand edge.

Figure 8A:
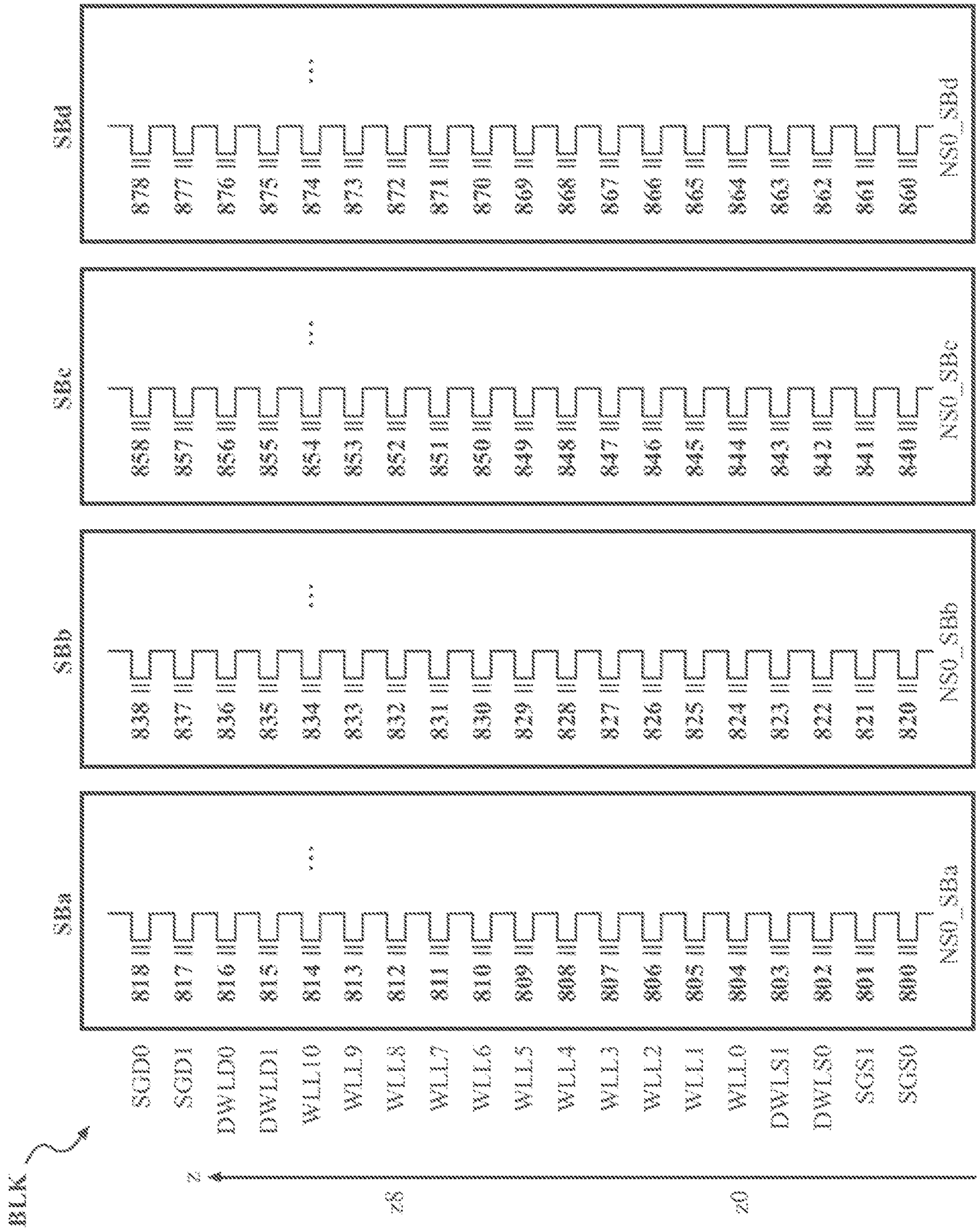
FIG. 8A depicts example NAND strings in the sub-blocks SBa-SBd of FIG. 7A.

FIG. 8A depicts example NAND strings in the sub-blocks SBa-SBd of FIG. 7A. The sub-blocks are consistent with the structure of FIG. 6B. The conductive layers in the stack are depicted for reference at the left hand side. Each sub-block includes multiple NAND strings, where one example NAND string is depicted. For example, SBa comprises an example NAND string NS0_SBa, SBb comprises an example NAND string NS0_SBb, SBc comprises an example NAND string NS0_SBc, and SBd comprises an example NAND string NS0_SBd.

Additionally, NS0_SBa include SGS transistors 800 and 801, dummy memory cells 802 and 803, data memory cells 804, 805, 806, 807, 808, 809, 810, 811, 812, 813 and 814, dummy memory cells 815 and 816, and SGD transistors 817 and 818.

NS0_SBb include SGS transistors 820 and 821, dummy memory cells 822 and 823, data memory cells 824, 825, 826, 827, 828, 829, 830, 831, 832, 833 and 834, dummy memory cells 835 and 836, and SGD transistors 837 and 838.

NS0_SBc include SGS transistors 840 and 841, dummy memory cells 842 and 843, data memory cells 844, 845, 846, 847, 848, 849, 850, 851, 852, 853 and 854, dummy memory cells 855 and 856, and SGD transistors 857 and 858.

NS0_SBd include SGS transistors 860 and 861, dummy memory cells 862 and 863, data memory cells 864, 865, 866, 867, 868, 869, 870, 871, 872, 873 and 874, dummy memory cells 875 and 876, and SGD transistors 877 and 878.

At a given height in the block, a set of memory cells in each sub-block are at a common height. For example, one set of memory cells (including the memory cell 804) is among a plurality of memory cells formed along tapered memory holes in a stack of alternating conductive and dielectric layers. The one set of memory cells is at a particular height z0 in the stack. Another set of memory cells (including the memory cell 824) connected to the one word line (WLL0) are also at the particular height. In another approach, the set of memory cells (e.g., including the memory cell 812) connected to another word line (e.g., WLL8) are at another height (z8) in the stack.

Figure 8B:
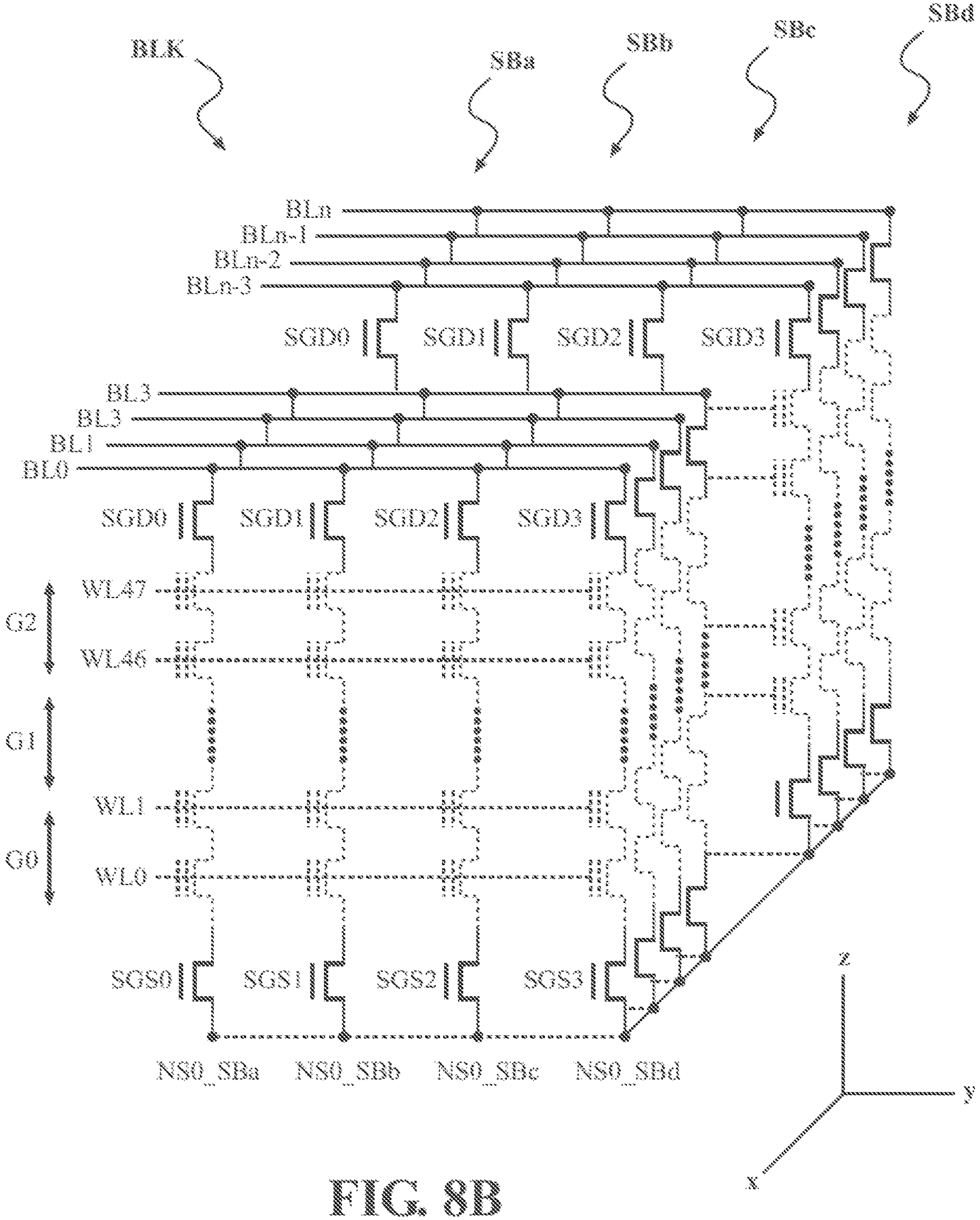
FIG. 8B depicts another example view of NAND strings in sub-blocks.

FIG. 8B depicts another example view of NAND strings in sub-blocks. The NAND strings includes NS0_SBa, NS0_SBb, NS0_SBc and NS0_SBd, which have 48 word lines, WL0-WL47, in this example. Each sub-block comprises a set of NAND strings which extend in the x direction and which have a common SGD line, e.g., SGD0, SGD1, SGD2 or SGD3. In this simplified example, there is only one SGD transistor and one SGS transistor in each NAND string. The NAND strings NS0_SBa, NS0_SBb, NS0_SBc and NS0_SBd are in sub-blocks SBa, SBb, SBc and SBd, respectively. Further, example, groups of word lines G0, G1 and G2 are depicted.

Figure 8C:
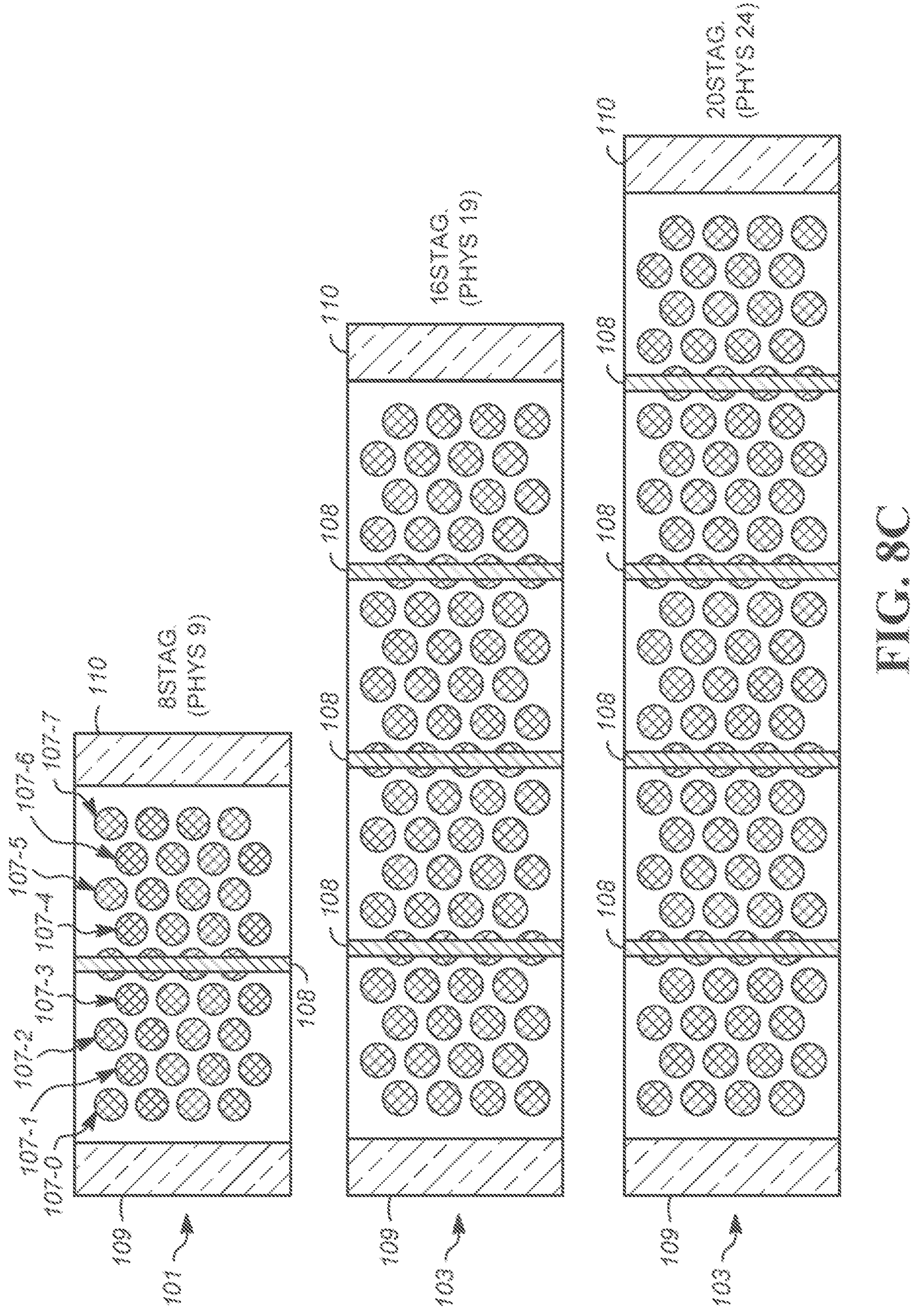
FIG. 8C depicts a top view of example word line layers of a stack.

FIG. 8C generally illustrates a schematic view of three versions of staggered string architecture 101, 103, 105 for BiCS memory, e.g., NAND. With reference the string architecture 101, the strings are shown in rows 107-0 through 107-7 in architecture 101. Each row is shown with four ends to the strings. A string may be connected to an adjacent string at an end (not visible beneath this view). A first group of rows 107-0 through 107-3 are shown on a left side of a dummy row 108. A second group of rows 107-4 through 107-7 are shown on a right side of the dummy row 108. The dummy row 108 separates the two groups of rows in the staggered eight row. A source line 109 is positioned at an edge of the first group and is remote from the dummy row 108. A source line 110 is positioned at an edge of the second group and is remote from the dummy row 108 and source line 109.

The staggered string architectures 103, 105 for BiCS memory are similar to that of architecture 101 except additional groups are added. Architecture 103 is double the size of architecture 101 and includes sixteen rows of strings with each group of four rows separated by a dummy row. Architecture 105 is larger than both the architecture 101 and the architecture 103. Architecture 105 includes twenty rows of strings with each group of four rows separated by a dummy row 108.

These architectures 101, 103, 105 can include a chip under array structure, e.g., the control circuitry is under the memory array that can include the groups of memory strings. With the chip under array structure, the strings may include a direct strap contact for the source line for read and erase operations.

When a memory cell is programmed, NWI from a neighboring memory cell may cause a Vth distribution to shift and widen. For example, with conventional full sequence programming, after PD, NWI will cause a memory cell with a neighbor (e.g., WLn+1) in high states to have higher Vth and a memory cell with a neighbor in low states to have a lower Vth, thereby widening the Vth distribution of the data state. After HTDR, Vth shifts down even more for memory cells with low state neighbors (e.g., either WLn+1 or WLn−1) as compared with memory cells with high state neighbors due to lateral DR.

In order to maintain effective data information and minimize FBC, conventional methodologies employed during read operations to compensate for DR loss include applying different read pass voltage (VREADK) values at WLn+1 or applying different read voltage (VCG) values at WLn (the selected word line). A different VREADK or VCG value may be applied to each "zone" of a plurality of zones to modulate WLn Vth distribution positions. The zones are formed based on data states of neighboring memory cells of WLn+1. WLn+1 may be read before performing a read operation on WLn to get WLn+1 state information. This helps to tighten Vth distributions. VREADK can also be used to compensate for device variations for different WL-WL distance.

The bias conditions for the word lines during a read operation may include the selected word line WLn receiving the read voltage VCGR which may be applied at one of the read compare levels. Further, word lines WLn−1 and WLn+1, which are adjacent to the selected word line WLn, receive a read pass voltage, VREADK, and the remaining word lines receive a read pass voltage, VREAD. VREAD is a read pass voltage applied at a level sufficient to turn on a cell in any of the programmed states. For example, VREAD may be applied at a level above the highest expected threshold voltage of a memory cell in the highest programmed state. VREADK is also a read pass voltage that is applied to turn on a memory cell in any programmed state. VREADK may be applied at a level higher than VREAD to compensate for a lower voltage at the adjacent word lines due to the lower VCGR voltages being applied to the selected word line. The remaining word lines are each adjacent to another word line receiving the VREAD voltage. In some instances, VREADK may be equal to VREAD.

Figure 12A:
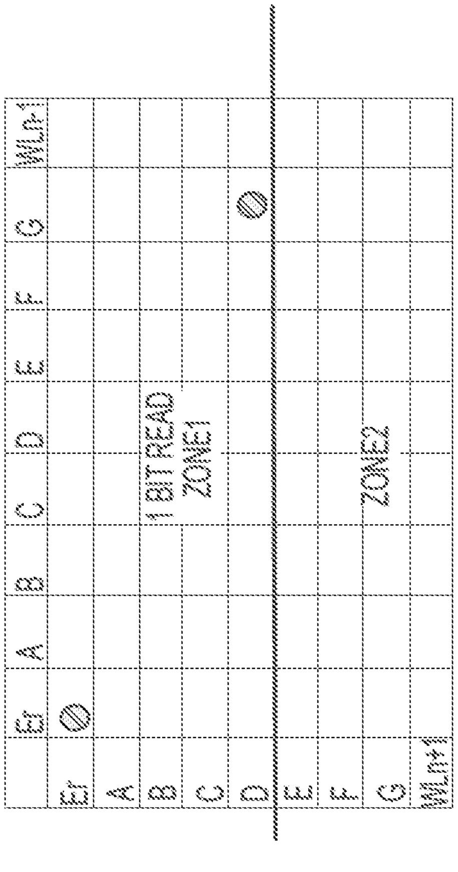
FIGS. 12A and 12B provide exemplary representations of zones identified for a one-bit and a two-bit read.
Figure 12B:
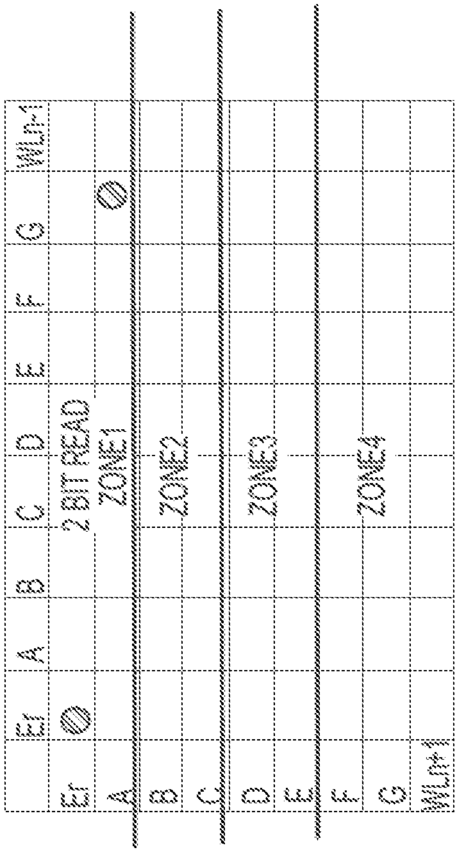

Grouping techniques used in the implementation of conventional methodologies referenced above are not optimal. In particular, these methodologies only account for WLn+1 in identifying zones. For example, FIGS. 12A and 12B provide exemplary representations of zones identified for a one-bit and a two-bit read. The zones depicted in FIGS. 12A and 12B are identified based on WLn+1 data states and do not account for the data states of memory cells of WLn−1. For example, in FIG. 12A, data states 'Er' to 'D' of WLn+1 are defined as zone one with all data states of WLn−1. Also, in FIG. 12A, data states 'E' to 'G' of WLn+1 are defined as zone two with all data states of WLn−1. However, WLn+1/WLn/WLn−1 data state combinations 'Er'/X/'Er' and 'G'/X/'G' should not be grouped within one zone because WLn+1/WLn/WLn−1 as 'Er'/X/'Er' would have a strong lateral e-field to extract charges away from a victim state (where 'Er'/X/'Er' may constitute a lower tail); whereas WLn+1/WLn/WLn−1 as 'G'/X/'G' may constitute an upper tail and donate charges to the victim. For example, as seen in FIG. 12A, reliance solely on WLn+1 data states to identify zones may allow for data state combinations such as 'Er'/'Er' for WLn+1/WLn−1 to be in the same zone as 'D'/'G' for WLn+1/WLn−1. Similarly, as seen in FIG. 12B, data state combinations such as 'Er'/'Er' for WLn+1/WLn−1 may be in the same zone as 'A'/'G' for WLn+1/WLn−1 of the four zones depicted in FIG. 12B. By including such data state combinations in a same zone, the Vth distribution may be widened and limit the lowest VREADK that may be applied.

Figures 13A, 13B:
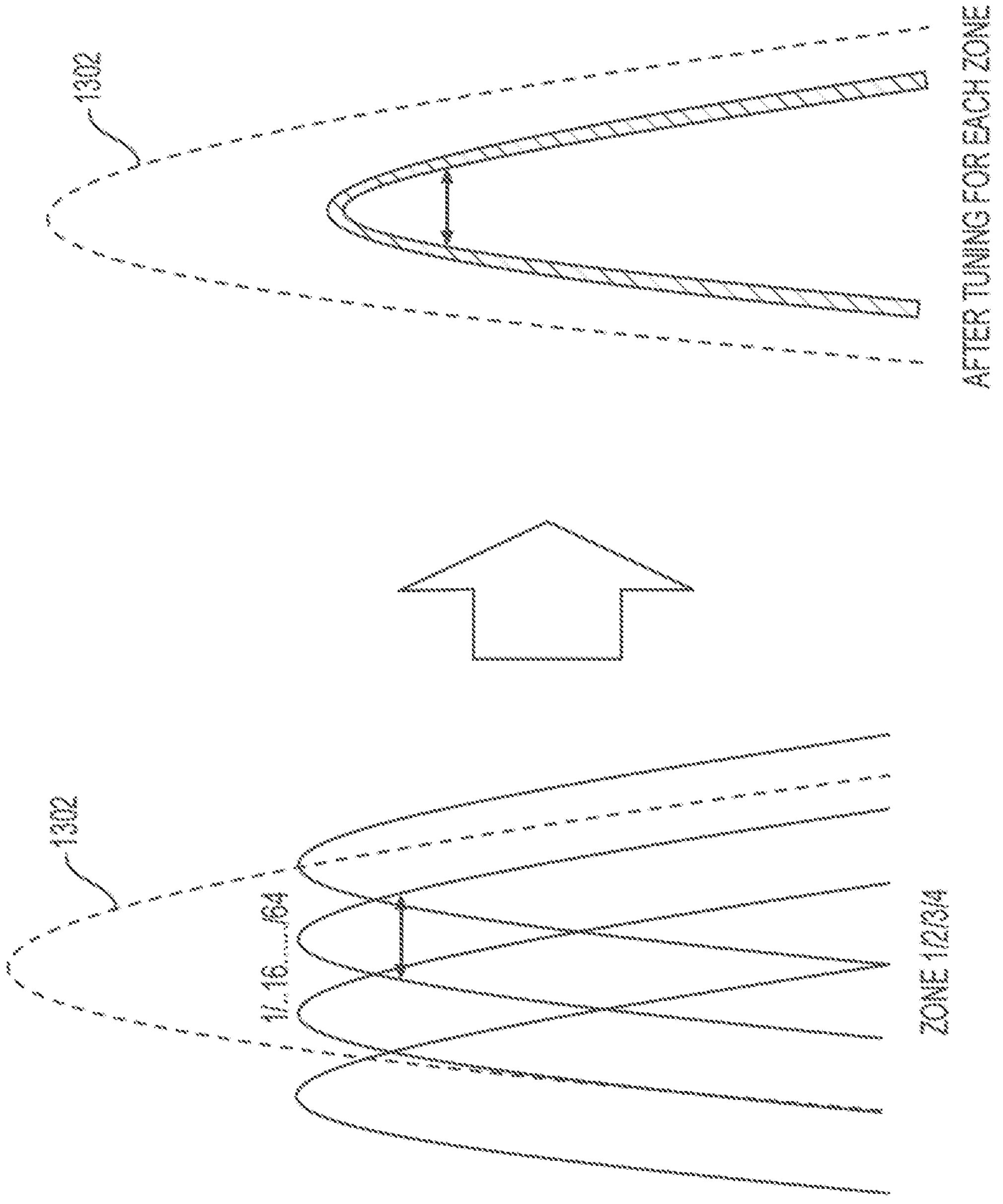
FIGS. 13A and 13B illustrates example graphical representations of an overall Vth distribution and four zones identified within the overall Vth distribution.

FIG. 13A illustrates example graphical representations of an overall Vth distribution 1302 and four zones identified within the overall Vth distribution based on data states of memory cells of a neighboring word line (e.g., WLn+1). As shown in FIG. 13B, during a read of WLn, applying different read pass voltage (VREADK) values at WLn+1 or applying different read voltage (VCG) values at WLn (the selected word line) may align the zones to the middle. A different VREADK or VCG value may be applied to each zone of a plurality of zones to modulate WLn Vth distribution positions. By grouping certain data state combinations (e.g., 'Er'/'Er' and 'G'/'G') into the same zone, can cause zone distributions to be wide and thereby, cause an overall Vth distribution to be wide when the zones are aligned to compensate for NWI and lateral DR effects.

To address the above, look neighbor ahead (LNA) method was implemented. Conventional LNA pre-read may form the most similar memory cells into one zone such that the final Vth distribution is tighter after alignment. The look neighbor ahead (LNA) pre-read method includes reading state information of both WLn+1 and WLn−1 before reading WLn and classifying combinations of data states of memory cells of WLn+1 and WLn−1 into different zones. Each zone may correspond to a data retention compensation scheme and a read operation may be performed on WLn including applying each data retention compensation scheme corresponding to any zones identified.

For conventional LNA reading of four zones in a stretched diagonal direction, each zone read operation occupies an entire R_CLK or RWL_CLK which involves a complete bitline charge and discharge operation. The sensing operation is always performed at a certain fixed Icell range (e.g., ~30 nA) for maximized sensing sensitivity and accuracy. The pre-read in LNA may be a rough read to determine the overall status of neighbor states. Accordingly, it may not need high accuracy as actual read (i.e., no FBC requirement). Therefore, a fast read method can be applied in the pre-read.

Figure 14:
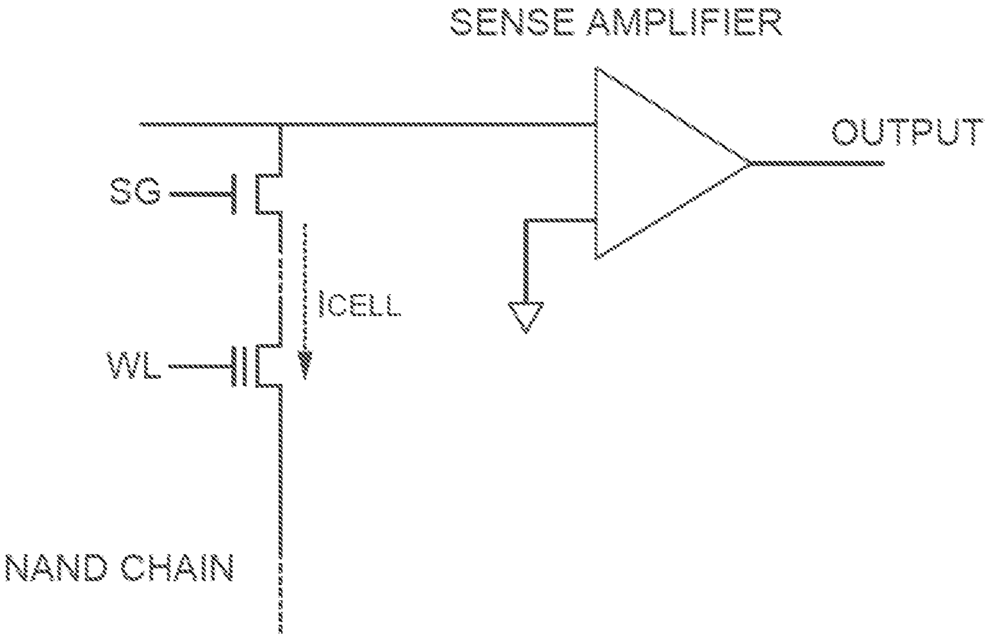
FIG. 14 provides an exemplary representation of a sense amplifier.

FIG. 14 provides an exemplary representation of a sense amplifier. In a normal sensing operation, VCG_R is applied on a selected wordline. With reference to FIG. 14, when Vth is high, Icell is low such that within pre-defined sense time, the voltage on SEN cap cannot flip due to the small Icell. However, and with continued reference to FIG. 14, when Vth is low, Icell is high such that with a pre-defined sense time, the voltage on SEN cap flips over due to a high and rapid voltage swing. In this way, Vth of selected wordline is read out. The sensing current is optimized in a value not too high (too much variation on the current due to process variations), nor too low (beyond the sense amplifier amplitude).

Embodiments described herein reduce pre-read time so that more zones can be classified without t_READ (i.e., total time to perform the read operation) penalty. For example, each zone read operation occupies an entire R_CLK or RWL_CLK which involves a complete bitline charge and discharge operation. The sensing operation is always performed at a certain fixed Icell range (e.g., ~30 nA) for maximized sensing sensitivity and accuracy. The pre-read in LNA is a rough read to judge the overall status of neighbor states; therefore, it does not need high accuracy as an actual read (because there is no FBC requirement). As such, a relaxed fast read method can be applied in the pre-read. The more zones that are defined, the more Vth margin that can be gained from the LNA read method (e.g., 8 zones). The embodiments described herein provide a fast read method so more zones can be defined in a single read operation.

Figure 15:
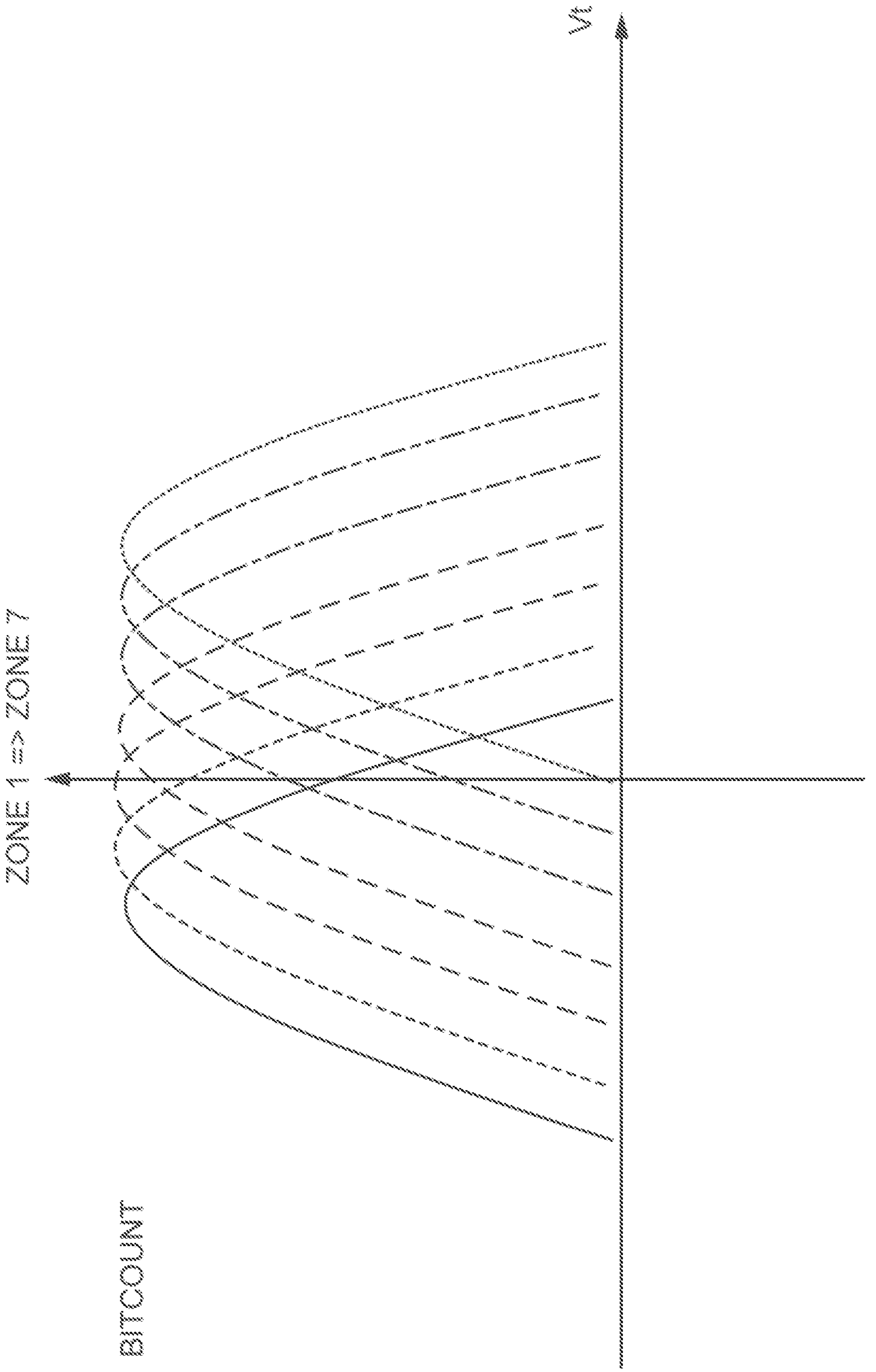
FIG. 15 provides an exemplary representation of a Vth modulation by bitline biases during WLn read.

FIG. 15 provides an exemplary representation of a Vth modulation by bitline biases during WLn read. A bitline from each zone can apply a unique a bit line clamping voltage (VBLC) during a read operation. Pre-read defines the zone borders so each bitline belongs to a specific zone according to its neighbor states combinations (e.g., from the neighbor states mapping shown in FIG. 17). The zone information may be stored in the data latch corresponding to each bitline. Vth of each bitline can be modulated by its VBLC bias during read. For example, as depicted in FIG. 15, the pre-read defines zones while each zone maps to a unique VBLC (e.g., 0.2/0.225/0.25/0.275/0.3/0.325/0.35V respectively for zones 1 through 7) as defined in the pre-read. For zones towards the upper left side in the neighbor states mapping may have lower relative Vth, thus its VBLC may be also lower. For zones towards the lower right side in the neighbor states mapping may have higher relative Vth, thus its VBLC may be also higher.

Figure 16:
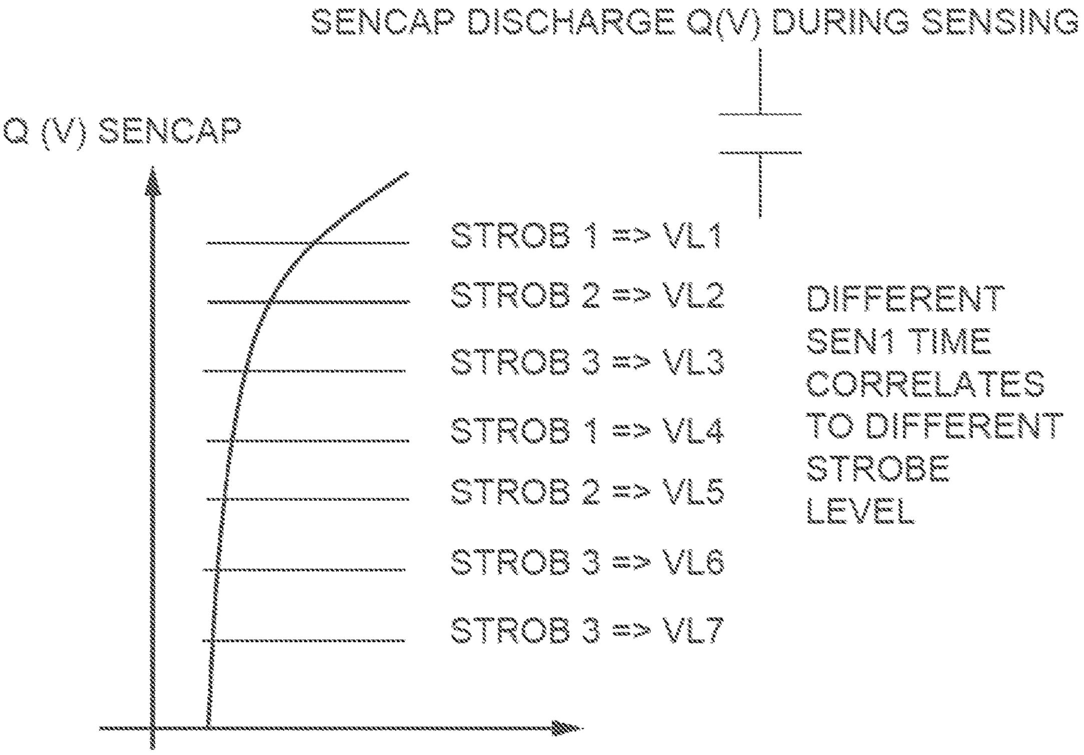
FIG. 16 provides an exemplary representation of SEN-CAP discharge Q(V) during sensing.

FIG. 16 provides an exemplary representation of SENCAP (as depicted in FIG. 14) discharge Q(V) during sensing. As depicted in FIG. 16, different SEN1 time correlates to a different strobe level. As further shown in FIG. 16, the SENCAP discharge diagram depicts a single reverse read to identify multiple verify levels. In some embodiments, this may be a rough read to define zones.

Figure 17:
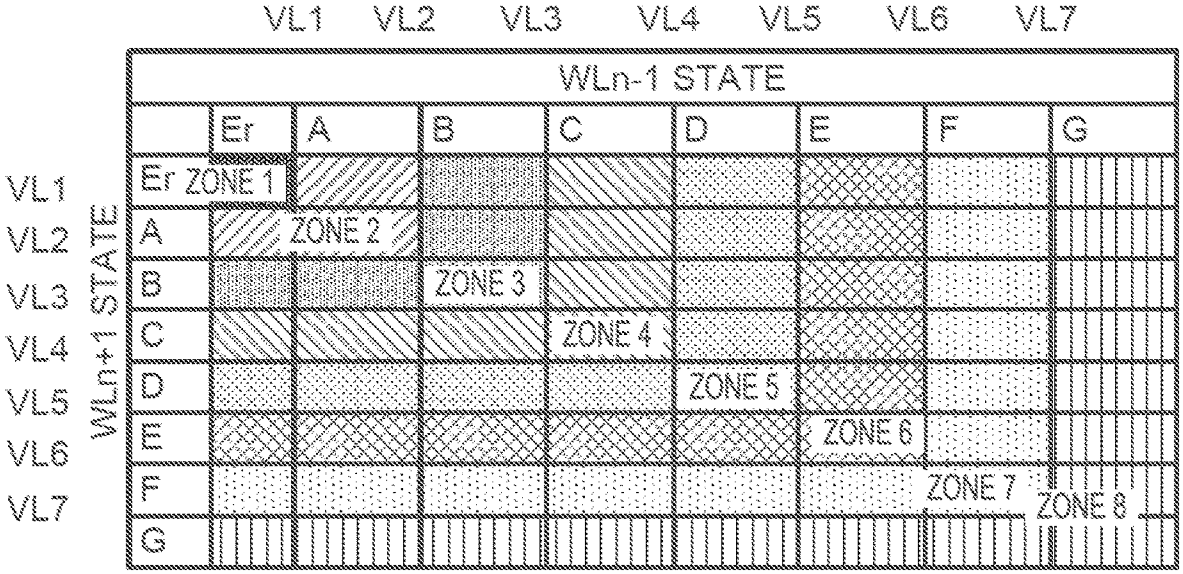
FIG. 17 provides an exemplary table of zone mappings to data state combinations.

FIG. 17 provides an exemplary table of zone mappings to data state combinations. An example of a fast dual wordline sensing pre-read in LNA read may include seven zone borders being classified during a single charge/discharge SEN cap operation in seven different strobes. As shown in the table of FIG. 17, data state 'Er' of a neighboring memory cell of WLn+1 and data state 'Er' of a neighboring memory cell of WLn−1 are mapped to a first zone, data state 'A' of a neighboring memory cell of WLn+1 and data state 'A' of a neighboring memory cell of WLn−1 are mapped to a second zone, data state 'C' of a neighboring memory cell of WLn+1 and data state 'C' of a neighboring memory cell of WLn−1 are mapped to a first zone, and so on. The border shape may take any shape (e.g., diagonal, L-shaped, etc.).

Figure 18:
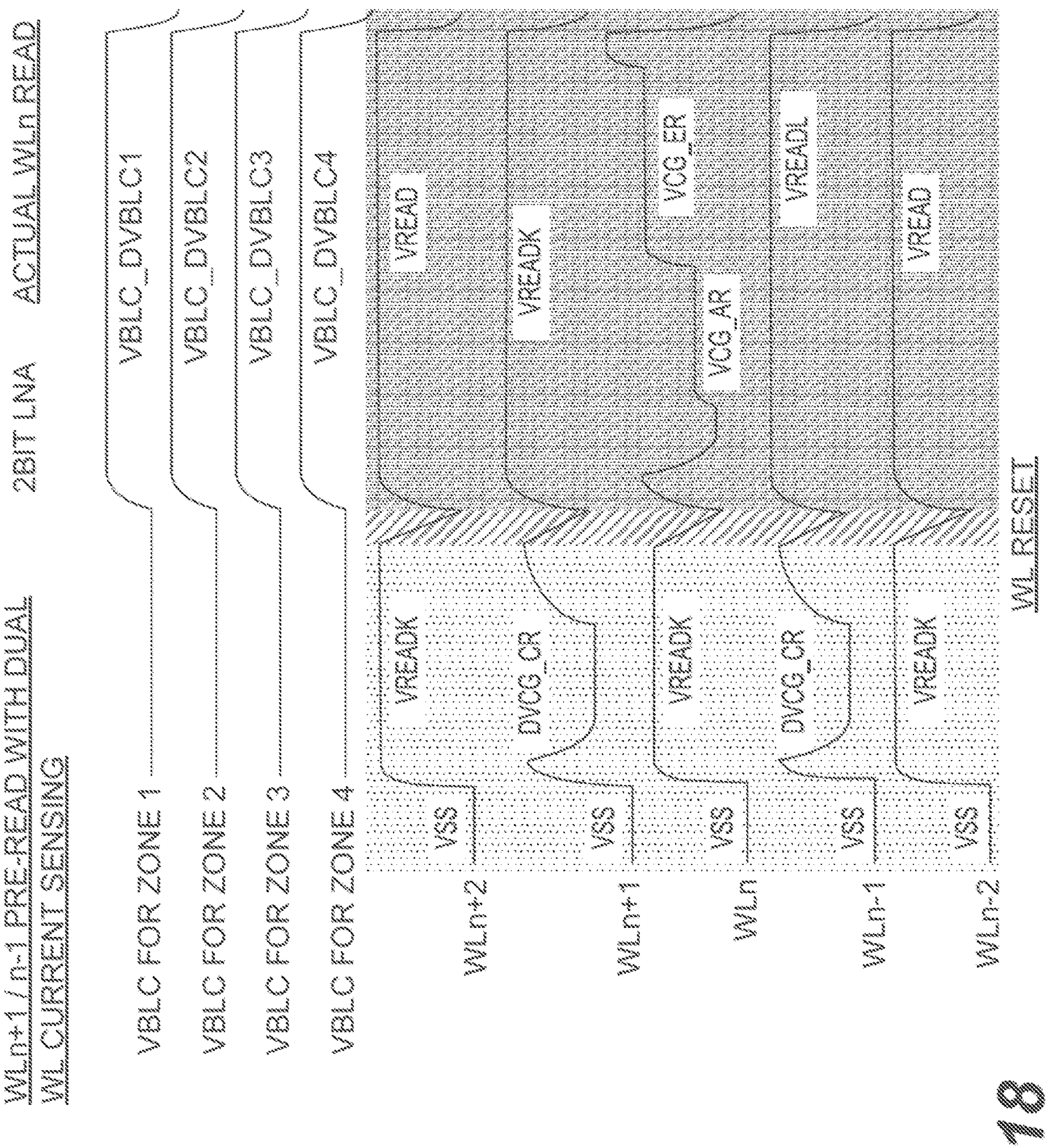
FIG. 18 provides an example implementation waveform of a fast look neighbor ahead.

FIG. 18 provides an example implementation waveform of a fast look neighbor ahead. For example, FIG. 18 depicts a WLn+1/n−1 pre-read with dual wordline current sensing and an actual WLn read. The waveform for WLn is identical to regular normal read but different bitlines are applied to different DVBLC according to zones defined in the pre-read step. FIG. 18 shows one example of normal order WLn read, i.e., low state to higher state in sequence. It also applies to reverse order read that higher to lower state for WLn read in sequence or any order in sequence.

In some embodiments, dummy wordlines Vth is known and fixed and therefore, it does not need to be included in the neighbor states pre-read. In some embodiments, the edge wordlines may need to be treated separately. That is, reading only one side neighbor state during the pre-read and judging zones based on that one side neighbor wordline Vth. Still yet, in some embodiments, different set of parameters (such as DVREADK, DVCG, DVBLC) for each zone, and/or the zone borders setting, during WLn read could be different depending on one side logic WLn+1 pre-read or one side logic WLn−1 pre read from other normal data wordlines with both side pre-read.

The embodiments disclosed herein are directed to a fast LNA read method to improve data read out accuracy with minimal t_READ penalty. Additionally, embodiments disclosed herein include the neighbor state zone border being defined in a single reverse read by adjusting the SEN1 time in sequence. It can identify neighbor state cells passing different verify levels (e.g., VL/VL2/VL3 . . . ) in a single charging/discharging process of one clock time to save the overall t_READ. The embodiments disclosed herein are directed to bitlines that belong to different zones that will be applied different VBLC during read. Zones with lower neighbor states that have lower relative Vth will be applied with lower VBLC during read. Zones with higher neighbor states that have higher relative Vth will be applied with higher VBLC during read.

In some embodiments, WLn+1/n−1 pre-read with dual WL current sensing and an actual WLn read with applying different VBLCs including can be combined or be separately applied in a read operation. In some embodiments, embodiments described herein may include the edge wordlines adjacent to dummy wordlines needing to be treated differently from normal wordlines that is pre-read one side of data wordliness only, either logic WLn−1 or WLn+1. The corresponding zone specified WLn reading parameter sets could be different from normal wordlines, for example, DVREADK or DVCG could be lowered for zone 4 and zone 3 for edge wordlines. In some embodiments, the fast read method can be applied to SLC/TLC/QLC/PLC/HLC/7LC or any other bitlines operations with LNA read.

To explore the foregoing in further detail FIG. 19 will now be described. FIG. 19 is a flowchart of a method 1900 for performing a fast look neighbor ahead pre-read. In some embodiments, method 1900 may be implemented by a controller, control circuitry, a processor, and/or the like, as described elsewhere herein. As shown in FIG. 19, method 1900 begins at a step 1902. At step 1902, data states are determined for a first set of memory cells of a first neighboring word line of the set of word lines and a second set of memory cells of a second neighboring word line of the set of word lines, where each of the data states are any of a plurality of data states that the first set and second set of memory cells are configured to store. The first and the second neighboring word lines are adjacent to a selected word line of the set of word lines. For example, assuming for illustration purposes WLL1 in FIG. 8A is the selected word line, a controller, such as sense circuit controller 560 described in FIG. 4A or controller 122 described in FIG. 1A, may determine data states for memory cells 806, 826, 846, and 866 (of word line WLL2) that neighbor memory cells 805, 825, 845, 865 of selected word line WLL1 and determine data states for memory cells 804, 824, 844, and 864 (of word line WLL0) that neighbor memory cells 805, 825, 845, 865 of selected word line WLL1.

More specifically, the controller may identify the data states of the memory cells included in each respective neighboring word line by performing one or more read operations (sometimes referred to as sense operations). The controller may, for example, perform a read operation to identify a data state of a memory cell of a physical neighboring word line (e.g., WLn−1, WLn+1, etc.) of a word line (e.g., WLn) by referencing a data structure supported by a data state latch (e.g., data state latch 548). The data structure may be used to store data state values for bits of neighboring memory cells (e.g., memory cells that are in the physical neighboring word lines). A data state may include an erased data state indicating that one or more bits of a memory cell have not been programmed or a programmed data state indicating that the one or more bits have been programmed (e.g., to a value of zero or one). Using a 3-bit memory cell architecture as an example, there may be one data state left in an erased data state ER and seven higher (or programmed) data states (represented by data state A, data state B, . . . , data state G).

In some embodiments, performing a read operation may include identifying one or more data states for a memory cell of the physical neighboring word line. In some embodiments, performing the read operation may include identifying data states for multiple memory cells of the physical neighboring word line. In some embodiments, performing the read operation may include identifying data states for multiple memory cells of multiple neighboring word lines (e.g., the physical neighboring WLn−1, the second neighboring word line WLn+1, etc.).

In FIG. 19, method 1900 further includes a step 1904. At step 1904, a zone of a plurality of zones is identified for each data state combination of the data states, where each data state combination comprises a data state of a memory cell of the first set of memory cells and a data state of a memory cell of the second set of memory cells and the memory cell of the first set of memory cells and the memory cell of the second set of memory cells being adjacent to a memory cell of a third set of memory cells of the selected word line. Each zone of the plurality of zones corresponds to a bit line clamping voltage.

For example, assuming for illustration purposes WLL1 in FIG. 8A is the selected word line, a controller, such as sense circuit controller 560 described in FIG. 4A or controller 122 described in FIG. 1A, may identify zones for data state combinations for the determined data states for memory cells 806, 826, 846, and 866 of word line WLL2 and determined data states for memory cells 804, 824, 844, and 864 of word line WLL0. Each zone of the plurality of zones corresponds to a data retention compensation scheme. The data retention compensation scheme may be applied during one or more read operations to be performed on selected word line WLL1, such that data retention compensation schemes corresponding to each zone of the plurality of zones may be used to offset an interference that memory cells 806, 826, 846, and 866 of word line WLL2 and 804, 824, 844, and 864 of word line WLL0 would otherwise have on memory cells 805, 825, 845, 865 of selected word line WLL1. In some embodiments, for example, WLn+1/WLn−1 is treated as one single current read, when current is above or below a certain level, the corresponding WLn+1 and WLn−1 combination is classified into one zone.

As further shown in FIG. 19, method 1900 includes a step 1906. At step 1906, a read operation is performed on the selected word line including applying each bit line clamping voltage corresponding to any zones of the plurality of zones identified for the third set of memory cells of the selected word line. For example, assuming for illustration purposes WLL1 in FIG. 8A is the selected word line, a controller, such as sense circuit controller 560 described in FIG. 4A or controller 122 described in FIG. 1A, may perform a read operation on selected word line WLL1 applying each bit line clamping voltage corresponding to any zones of the plurality of zones identified when performing a read process on memory cells 805, 825, 845, 865 of WLL1.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A storage device, comprising:

a non-volatile memory including control circuitry and an array of memory cells formed using a set of word lines and a set of bit lines; and a controller, coupled to the non-volatile memory, configured to:

determine data states for a first set of memory cells of a first word line of the set of word lines and a second set of memory cells of a second word line of the set of word lines, each of the data states being any of a plurality of data states that the first set and second set of memory cells are configured to store, the first and the second word lines being adjacent to a selected word line of the set of word lines, wherein determining data states for the first set of memory cells of the first word line and the second set of memory cells of the second word line includes performing a read operation with dual wordline current sensing;

identify a zone of a plurality of zones for each data state combination of the data states, each data state combination comprising a data state of a memory cell of the first set of memory cells and a data state of a memory cell of the second set of memory cells, the memory cell of the first set of memory cells and the memory cell of the second set of memory cells being adjacent to a memory cell of a third set of memory cells of the selected word line, and wherein each zone of the plurality of zones corresponds to a bit line clamping voltage; and perform a read operation on the selected word line including applying each bit line clamping voltage corresponding to any zones of the plurality of zones identified for the third set of memory cells of the selected word line.

2. The storage device as set forth in claim 1, wherein each data state combination of a first zone of the plurality of zones comprises a data state of a memory cell of the first set of memory cells from a first set of data states and a data state of a memory cell of the second set of memory cells from a second set of data states, wherein the first set of data states includes same data states as the second set of data states.

3. The storage device as set forth in claim 1, wherein apply each bit line clamping voltage includes:

applying a first bit line clamping voltage value for a first zone of the plurality of zones; and applying a second bit line clamping voltage value for a second zone of the plurality of zones, wherein the first bit line clamping voltage value is different from the second bit line clamping voltage value.

4. The storage device as set forth in claim 1, wherein apply each bit line clamping voltage includes applying different bit line clamping voltage values for each zone of the plurality of zones identified for the third set of memory cells of the selected word line.

5. The storage device as set forth in claim 1, wherein zones of the plurality of zones with lower neighbor states will be applied with lower bit line clamping voltages than zones of the plurality of zones with higher neighbor states.

6. The storage device as set forth in claim 1, wherein zones of the plurality of zones with higher neighbor states will be applied with higher bit line clamping voltages than zones of the plurality of zones with lower neighbor states.

7. A method of operating a memory apparatus including a plurality of memory cells, the method comprising the steps of:

determining data states for a first set of memory cells of a first word line of the set of word lines and a second set of memory cells of a second word line of the set of word lines, each of the data states being any of a plurality of data states that the first set and second set of memory cells are configured to store, the first and the second word lines being adjacent to a selected word line of the set of word lines, wherein determining data states for the first set of memory cells of the first word line and the second set of memory cells of the second word line includes performing a read operation with dual wordline current sensing;

identifying a zone of a plurality of zones for each data state combination of the data states, each data state combination comprising a data state of a memory cell of the first set of memory cells and a data state of a memory cell of the second set of memory cells, the memory cell of the first set of memory cells and the memory cell of the second set of memory cells being adjacent to a memory cell of a third set of memory cells of the selected word line, and wherein each zone of the plurality of zones corresponds to a bit line clamping voltage; and performing a read operation on the selected word line including applying each bit line clamping voltage corresponding to any zones of the plurality of zones identified for the third set of memory cells of the selected word line.

8. The method as set forth in claim 7, wherein each data state combination of a first zone of the plurality of zones comprises a data state of a memory cell of the first set of memory cells from a first set of data states and a data state of a memory cell of the second set of memory cells from a second set of data states, wherein the first set of data states includes same data states as the second set of data states.

9. The method as set forth in claim 7, wherein applying each bit line clamping voltage includes:

applying a first bit line clamping voltage value for a first zone of the plurality of zones; and applying a second bit line clamping voltage value for a second zone of the plurality of zones, wherein the first bit line clamping voltage value is different from the second bit line clamping voltage value.

10. The method as set forth in claim 7, wherein applying each bit line clamping voltage includes applying different bit line clamping voltage values for each zone of the plurality of zones identified for the third set of memory cells of the selected word line.

11. The method as set forth in claim 7, wherein zones of the plurality of zones with lower neighbor states will be applied with lower bit line clamping voltages than zones of the plurality of zones with higher neighbor states.

12. The method as set forth in claim 7, wherein zones of the plurality of zones with higher neighbor states will be applied with higher bit line clamping voltages than zones of the plurality of zones with lower neighbor states.

13. A controller in communication with a plurality of memory cells of a memory apparatus, the controller configured to:

determine data states for a first set of memory cells of a first word line of the set of word lines and a second set of memory cells of a second word line of the set of word lines, each of the data states being any of a plurality of data states that the first set and second set of memory cells are configured to store, the first and the second word lines being adjacent to a selected word line of the set of word lines, wherein determining data states for the first set of memory cells of the first word line and the second set of memory cells of the second word line includes performing a read operation with dual wordline current sensing;

identify a zone of a plurality of zones for each data state combination of the data states, each data state combination comprising a data state of a memory cell of the first set of memory cells and a data state of a memory cell of the second set of memory cells, the memory cell of the first set of memory cells and the memory cell of the second set of memory cells being adjacent to a memory cell of a third set of memory cells of the selected word line, and wherein each zone of the plurality of zones corresponds to a bit line clamping voltage; and perform a read operation on the selected word line including applying each bit line clamping voltage corresponding to any zones of the plurality of zones identified for the third set of memory cells of the selected word line.

14. The controller as set forth in claim 13, wherein each data state combination of a first zone of the plurality of zones comprises a data state of a memory cell of the first set of memory cells from a first set of data states and a data state of a memory cell of the second set of memory cells from a second set of data states, wherein the first set of data states includes same data states as the second set of data states.

15. The controller as set forth in claim 13, wherein apply each bit line clamping voltage includes:

applying a first bit line clamping voltage value for a first zone of the plurality of zones; and applying a second bit line clamping voltage value for a second zone of the plurality of zones, wherein the first bit line clamping voltage value is different from the second bit line clamping voltage value.

16. The controller as set forth in claim 13, wherein apply each bit line clamping voltage includes applying different bit line clamping voltage values for each zone of the plurality of zones identified for the third set of memory cells of the selected word line.

17. The controller as set forth in claim 13, wherein zones of the plurality of zones with lower neighbor states will be applied with lower bit line clamping voltages than zones of the plurality of zones with higher neighbor states.

* * * * *